US010879218B2

(12) United States Patent
Ruan et al.

(10) Patent No.: US 10,879,218 B2
(45) Date of Patent: Dec. 29, 2020

(54) DISPLAY DEVICE AND METHOD OF MANUFACTURING THE SAME

(71) Applicant: AU Optronics Corporation, Hsin-Chu (TW)

(72) Inventors: Cheng-He Ruan, Hsin-Chu (TW); Jian-Jhou Tseng, Hsin-Chu (TW); Chih-Yuan Hou, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/699,824

(22) Filed: Dec. 2, 2019

(65) Prior Publication Data

US 2020/0373281 A1  Nov. 26, 2020

(30) Foreign Application Priority Data

May 22, 2019  (TW) .............................. 108117731 A

(51) Int. Cl.
*H01L 25/075* (2006.01)
*H01L 27/12* (2006.01)
*H01L 33/62* (2010.01)
*H01L 33/58* (2010.01)

(52) U.S. Cl.
CPC ...... *H01L 25/0753* (2013.01); *H01L 27/1214* (2013.01); *H01L 33/58* (2013.01); *H01L 33/62* (2013.01); *H01L 2933/0058* (2013.01); *H01L 2933/0066* (2013.01)

(58) Field of Classification Search
CPC . H01L 25/0753; H01L 33/58; H01L 27/1214; H01L 33/62; H01L 2933/0058; H01L 2933/0066
See application file for complete search history.

(56) References Cited

U.S. PATENT DOCUMENTS

| 2011/0031527 | A1* | 2/2011 | Kotani | .................... | C08K 3/013 |
| | | | | | 257/100 |
| 2012/0097986 | A1* | 4/2012 | Ku | .......................... | H01L 24/97 |
| | | | | | 258/88 |
| 2013/0082292 | A1* | 4/2013 | Wei | ......................... | H01L 33/60 |
| | | | | | 257/98 |
| 2013/0299859 | A1* | 11/2013 | Onai | .................... | H05K 1/0306 |
| | | | | | 257/98 |
| 2014/0151734 | A1 | 6/2014 | Ito et al. | | |
| 2016/0372645 | A1* | 12/2016 | Sakai | .................. | C08K 5/5425 |

(Continued)

FOREIGN PATENT DOCUMENTS

| CN | 103650179 A | 3/2014 |
| CN | 108140586 A | 6/2018 |

(Continued)

*Primary Examiner* — Victor A Mandala
(74) *Attorney, Agent, or Firm* — McClure, Qualey & Rodack, LLP

(57) ABSTRACT

A method of manufacturing a display device includes the following steps. A bonding pad is formed on a dielectric layer. A light-shielding material is formed on the dielectric layer. A temperature of the light-shielding material is increased such that the light-shielding material is cured into a light-shielding layer. During curing the light-shielding material into the light-shielding layer, the light-shielding material flows to and contacts a portion of a surface of the bonding pad. A light-emitting element is electrically connected to the bonding pad.

4 Claims, 19 Drawing Sheets

(56) References Cited

U.S. PATENT DOCUMENTS

| | | | |
|---|---|---|---|
| 2017/0125644 A1* | 5/2017 | Tsuchiya | H01L 33/62 |
| 2017/0207376 A1* | 7/2017 | Kimura | H01L 24/97 |
| 2017/0229615 A1* | 8/2017 | Kuramoto | H01L 33/34 |
| 2017/0263828 A1* | 9/2017 | Mao | H01L 33/62 |
| 2018/0083218 A1 | 3/2018 | Choi et al. | |

FOREIGN PATENT DOCUMENTS

| | | |
|---|---|---|
| JP | 2015126209 A | 7/2015 |
| JP | 2015211158 A | 11/2015 |
| TW | 201814880 A | 4/2018 |

\* cited by examiner

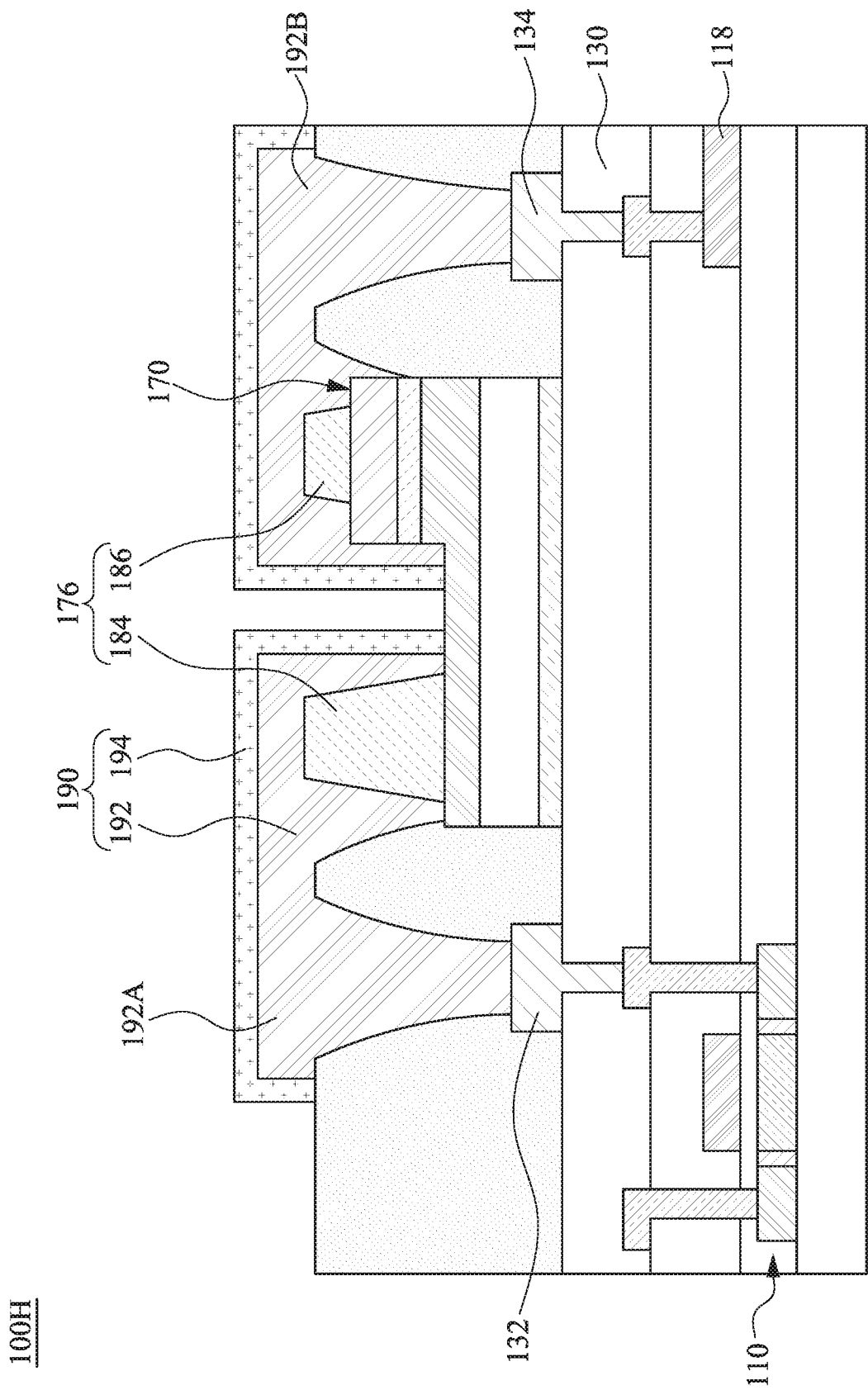

DISPLAY DEVICE AND METHOD OF MANUFACTURING THE SAME

CROSS-REFERENCE TO RELATED APPLICATION

This application claims priority to Taiwan Application Serial Number 108117731, filed May 22, 2019, which is herein incorporated by reference in its entirety.

BACKGROUND

Technical Field

The present disclosure relates to a display device and a method of manufacturing the same.

Description of Related Art

In recent years, light-emitting diode (LED) has been widely used in the application of consumer electronic products. The light-emitting diode has many advantages, such as lower energy consumption, longer life, smaller size and faster switching, so that it is suitable to be used as light source. In addition, light-emitting diode has also been applied in display device. The light-emitting diode in the display device can be driven by the thin film transistor or the wiring layer. However, in such an architecture, some of the elements may reflect ambient light, so as to result in light leakage of the display device and lower the display quality. Therefore, how to improve the aforementioned problems has become one of the research topics in related fields currently.

SUMMARY

One embodiment of the present disclosure is to provide a method of manufacturing a display device includes the following steps. A bonding pad is formed on a dielectric layer. A light-shielding material is formed on the dielectric layer. The temperature of the light-shielding material is increased to cure the light-shielding material into a light-shielding layer. During curing the light-shielding material into the light-shielding layer, the light-shielding material flows to and contacts a portion of a surface of the bonding pad. A light-emitting element is electrically connected to the bonding pad.

In some embodiment, increasing the temperature of the light-shielding material is performed after forming the bonding pad and before electrically connecting the light-emitting element to the bonding pad.

In some embodiment, during curing the light-shielding material into the light-shielding layer, the light-shielding material flows to and contacts a portion of a surface of the light-emitting element.

In some embodiment, the temperature of the light-shielding material is increased such that the temperature of the light-shielding material is in a range from 180° C. to 250° C.

One embodiment of the present disclosure is to provide a display device including a dielectric layer, a bonding pad, a light-emitting element, and a light-shielding layer. The bonding pad is disposed on the dielectric layer. The light-emitting element is disposed on the dielectric layer, and is electrically connected to the bonding pad. The light-shielding layer is disposed on the dielectric layer, and at least covers and contacts a portion of a surface of the bonding pad.

In some embodiment, a thickness of the light-shielding layer is in a range from 30 microns to 100 microns.

In some embodiment, the bonding pad has an top surface and a side surface, and the light-shielding layer extends from the side surface of the bonding pad to the top surface of the bonding pad.

In some embodiment, the light-emitting element includes a substrate, a semiconductor structure and an electrode structure, the semiconductor structure is located between the electrode structure and the substrate, the electrode structure is located between the bonding pad and the semiconductor structure, and the light-shielding layer contacts the light-emitting element, wherein the substrate has an top surface facing away from the bonding pad, and the light-shielding layer covers a portion of the top surface of the substrate.

In some embodiment, the light-emitting element includes a semiconductor structure and an electrode structure, the semiconductor structure is located between the bonding pad and the electrode structure, and the light-shielding layer contacts the semiconductor structure.

In some embodiment, the light-emitting element includes a first electrode and a second electrode, and the light-shielding layer extends to between the first electrode and the second electrode.

By the aforementioned arrangement, since the light-shielding layer covers and contacts a portion of the surface (e.g., the side surface or the top surface) of the bonding pad, the probability of that the display device reflects the ambient light can be reduced. As a result, it avoids the condition that the pixels of the display device have non-uniform color while in a bright state, and also avoids the condition that the pixel of the display device has white spot while in a dark state.

BRIEF DESCRIPTION OF THE DRAWINGS

FIG. 8A to FIG. 8C illustrate schematic side views of the method of manufacturing a display device in various stages according to an eighth embodiment of the present disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other words, in some embodiments of the present invention, these practical details are not necessary. Moreover, some well-known structures and devices are schematically depicted in order to simplify the drawings.

In the present disclosure, it is comprehensible that terms such as first, second, and third are used to describe various elements or areas. The terms are used for identifying single element or area. Therefore, the following first element or area may also be called as the second element or area without departing from the intention of the present disclosure. "Approximately" or "substantially" used herein includes an average value within an acceptable deviation range and the described value. For example, "approximately" or "substantially" may represent being within one or more standard deviations of the described value, or within ±30%, ±20%, ±10%, or ±5%.

The present disclosure is to provide a method of manufacturing a display device. In the manufacturing phases, a light-shielding layer is formed to cover and contact a portion of a surface (e.g., the side surface or the top surface) of a bonding pad, such that a probability of that the display device reflects ambient light can be reduced.

Figure 1A:
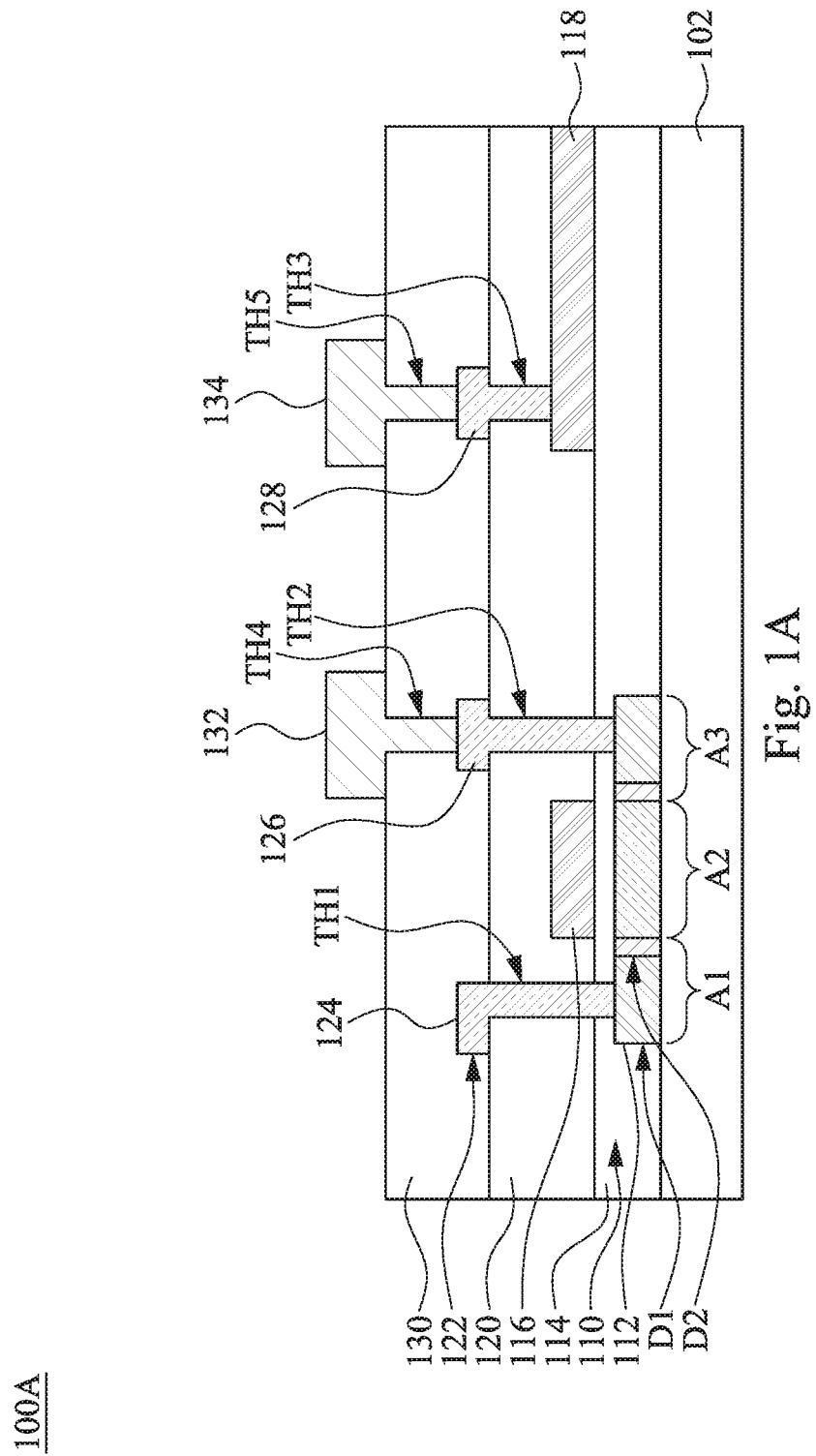
FIG. 1A to FIG. 1E illustrate schematic side views of the method of manufacturing a display device in various stages according to a first embodiment of the present disclosure.

Reference is made to FIG. 1A to FIG. 1E. FIG. 1A to FIG. 1E illustrate schematic side views of a method of manufacturing a display device 100A in various stages according to a first embodiment of the present disclosure. As shown in FIG. 1A, a thin film transistor 110 can be formed on the substrate 102. In some embodiments, the substrate 102 can be a light transmissive substrate such as a glass substrate. The layers of the thin film transistor 110 may be sequentially formed. In particular, first of all, a channel layer 112 can be formed on the substrate 102, and then a gate insulating layer 114 can be formed such that the gate insulating layer 114 covers the substrate 102 and the channel layer 112. Thereafter, a first metal layer can be formed on the gate insulating layer 114, and the first metal layer is patterned so as to form a gate electrode 116 of the thin film transistor 110 and a first patterned metal layer 118. In some embodiments, the first patterned metal layer 118 can be used as a common electrode of the display device 100A.

In some embodiments, a material of the channel layer 112 may include a crystalline silicon material or an amorphous silicon material, such as a monocrystalline silicon, microcrystalline silicon, polycrystalline silicon, metal oxide or the like. In some embodiments, the gate insulating layer 114 may include an inorganic material such as silicon oxide (SiOx), silicon nitride (SiNx), a composite layer composed of silicon oxide and silicon nitride, other suitable dielectric materials, or a combination thereof.

In the process of forming the thin film transistor 110, a conductivity of a portion of the channel layer 112 can be changed by diffusion, ion implantation, plasma processing or other suitable processes, so as to define a conductor region and a semiconductor region. For example, the channel layer 112 can be divided into a first region A1, a second region A2, and a third region A3. The second region A2 is located between the first region A1 and the third region A3. Each of the first region A1 and the third region A3 may include a heavily doped region D1 and a lightly doped region D2, and doping concentrations of the heavily doped region D1 and the lightly doped region D2 are greater than a doping concentration of the second region A2. As a result, the conductivities of the first region A1 and the third region A3 are greater than the conductivity of the second region A2.

In addition, the vertical projection of the gate electrode 116 on the channel layer 112 overlaps the second region A2.

The aforementioned arrangement is only an example, in some embodiments, the lightly doped region D2 may be omitted or other doping distribution may be adopted. In such an arrangement, the second region A2 can be a semiconductor region and used as a channel region, and the first region A1 and the third region A3 can be conductor regions and can be used as a source/drain region. In some embodiments, the first region A1 and the third region A3 may be doped with P-type or N-type dopants to form the heavily doped region D1 and the lightly doped region D2. In other embodiments, the channel region and the source/drain region of the thin film transistor 110 may also be formed by different layers.

After the thin film transistor 110 is formed, a dielectric layer 120 can be formed on the gate insulating layer 114, and the dielectric layer 120 covers the gate electrode 116 and the first patterned metal layer 118. In some embodiments, the dielectric layer 120 may include an organic material or an inorganic material, such as epoxy resin, silicon oxide (SiOx), silicon nitride (SiNx), a composite layer composed of silicon oxide and silicon nitride, or a combination thereof.

Next, a portion of the dielectric layer 120 and a portion of the gate insulating layer 114 may be removed to form a first contact hole TH1, a second contact hole TH2, and a third contact hole TH3. In particular, the dielectric layer 120 has the first contact hole TH1 and the second contact hole TH2 in conjunction with the gate insulating layer 114, and the dielectric layer 120 has the third contact hole TH3. The first contact hole TH1 and the second contact hole TH2 respectively expose the first region A1 and the third region A3 of the channel layer 112, and the third contact hole TH3 exposes the first patterned metal layer 118. Thereafter, a first conductor film can be formed on the dielectric layer 120, and the first conductor film is patterned so as to form a wiring layer 122. In some embodiments, the material of the first conductor film may be a metal or an alloy, such as titanium, aluminum, tungsten, copper, or a combination thereof. The wiring layer 122 includes a first conductive portion 124, a second conductive portion 126, and a third conductive portion 128. The first conductive portion 124 and the second conductive portion 126 are respectively located in the first contact hole TH1 and the second contact hole TH2, and are respectively connected to the first region A1 and the third region A3 of the channel layer 112. The first region A1 of the channel layer 112 is electrically connected to the other layers through the first conductive portion 124 of the wiring layer 122. The third conductive portion 128 is located in the third contact hole TH3 and is connected to the first patterned metal layer 118.

After the wiring layer 122 is formed, a passivation layer 130 can be formed on the wiring layer 122, and the passivation layer 130 covers the wiring layer 122. In some embodiments, the passivation layer 130 may include an organic material or an inorganic material, such as an epoxy resin, silicon oxide (SiOx), silicon nitride (SiNx), a composite layer composed of silicon oxide and silicon nitride, or a combination thereof. In some embodiments, the thickness of the passivation layer 130 can be in a range from 2 microns to 3 microns, the passivation layer 130 with such the thickness is water repellent for the layers or elements therebelow.

Next, a portion of the passivation layer 130 can be removed to form a fourth contact hole TH4 and a fifth contact hole TH5. The fourth contact hole TH4 and the fifth contact hole TH5 of the passivation layer 130 respectively expose the second conductive portion 126 and the third conductive portion 128 of the wiring layer 122. Thereafter, a second conductor film can be formed on the passivation layer 130, and the second conductor film is patterned so as to form conductive pads 132 and 134. In some embodiments, the material of the second conductor film may be a metal or an alloy, such as titanium, aluminum, tungsten, copper, or a combination thereof. The conductive pads 132 and 134 are respectively located in the fourth contact hole TH4 and the fifth contact hole TH5, and are respectively connected to the second conductive portion 126 and the third conductive portion 128 of the wiring layer 122.

Figure 1B:
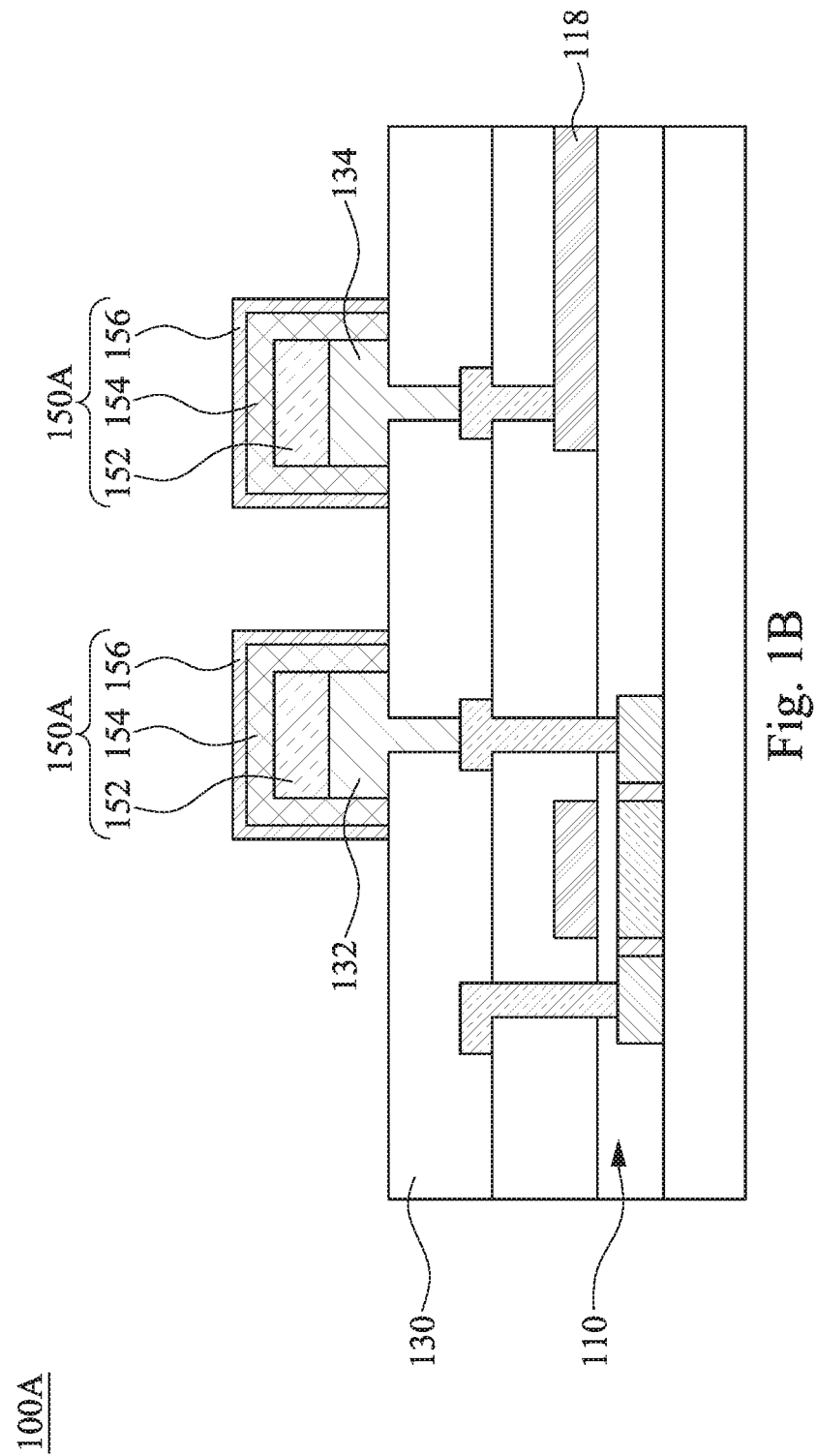
Figure 1C:
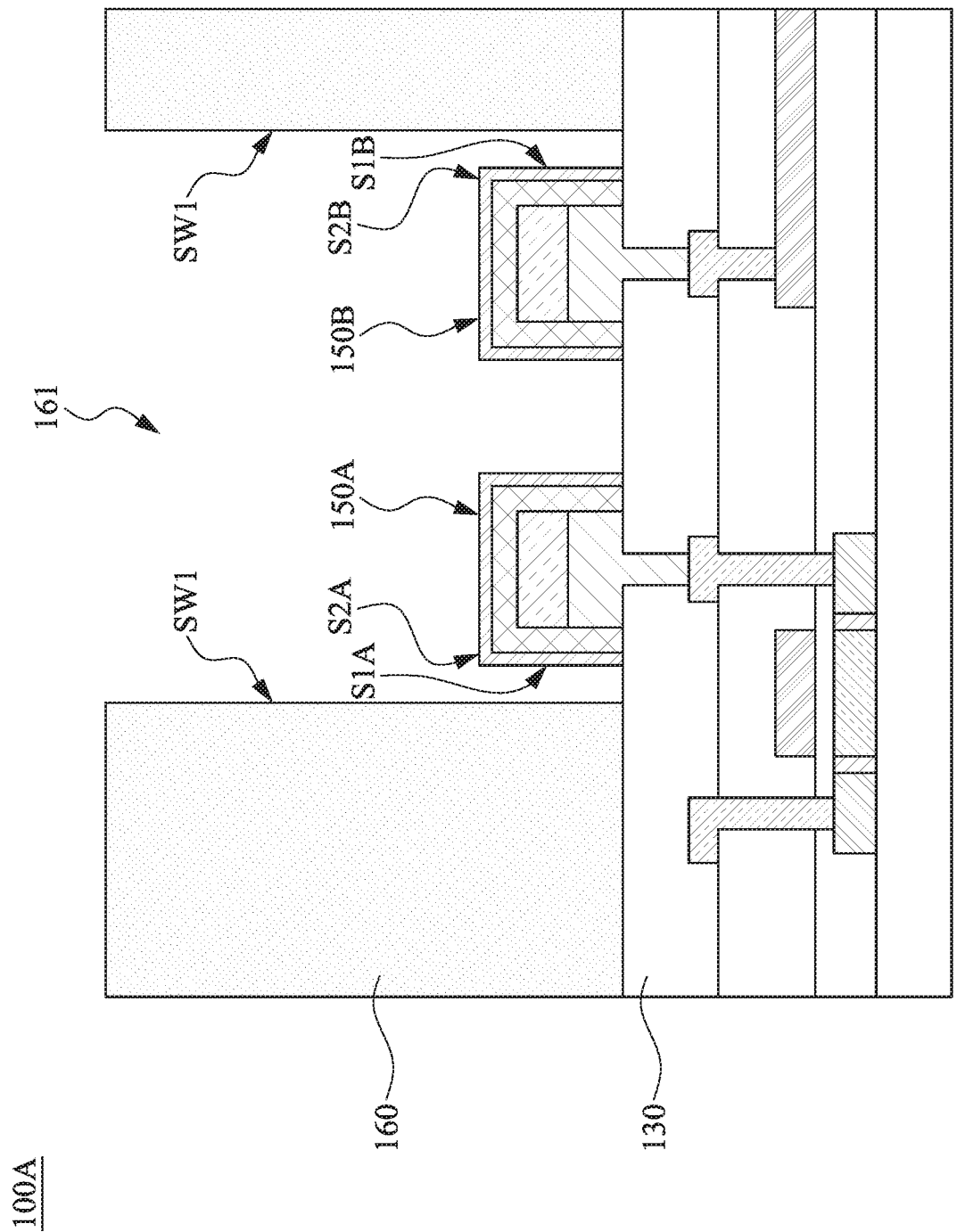

As shown in FIG. 1B, conductive structures 150A and 150B can be formed on the passivation layer 130. Each of the conductive structures 150A and 150B may be composite structure and has a thickness in a range from about 2 microns to 3 microns. For example, each of the conductive structures 150A and 150B can include a first conductive layer 152, a second conductive layer 154, and a third conductive layer 156. The first conductive layer 152 is disposed on the conductive pads 132 and 134. The second conductive layer 154 covers the first conductive layer 152 and the corresponding conductive pads 132 or 134. The third conductive layer 156 covers the second conductive layer 154. The materials of the first conductive layer 152, the second conductive layer 154, and the third conductive layer 156 may be different. In some embodiments, the first conductive layer 152 can be formed of copper, the second conductive layer 154 can be formed of nickel, and the third conductive layer 156 can be formed of gold. Such a material arrangement can facilitate electrical signal conduction.

The conductive structure 150A is electrically connected to the thin film transistor 110 through the conductive pad 132, and the conductive structure 150B is electrically connected to the first patterned metal layer 118 through the conductive pad 134. In some embodiments, the respective projection areas of the conductive structures 150A and 150B on the passivation layer 130 may be rectangular in shape and have a length and a width, wherein the length may be in a range from 30 microns to 150 microns, and the width may be in a range from 30 microns to 90 microns.

Figure 1D:
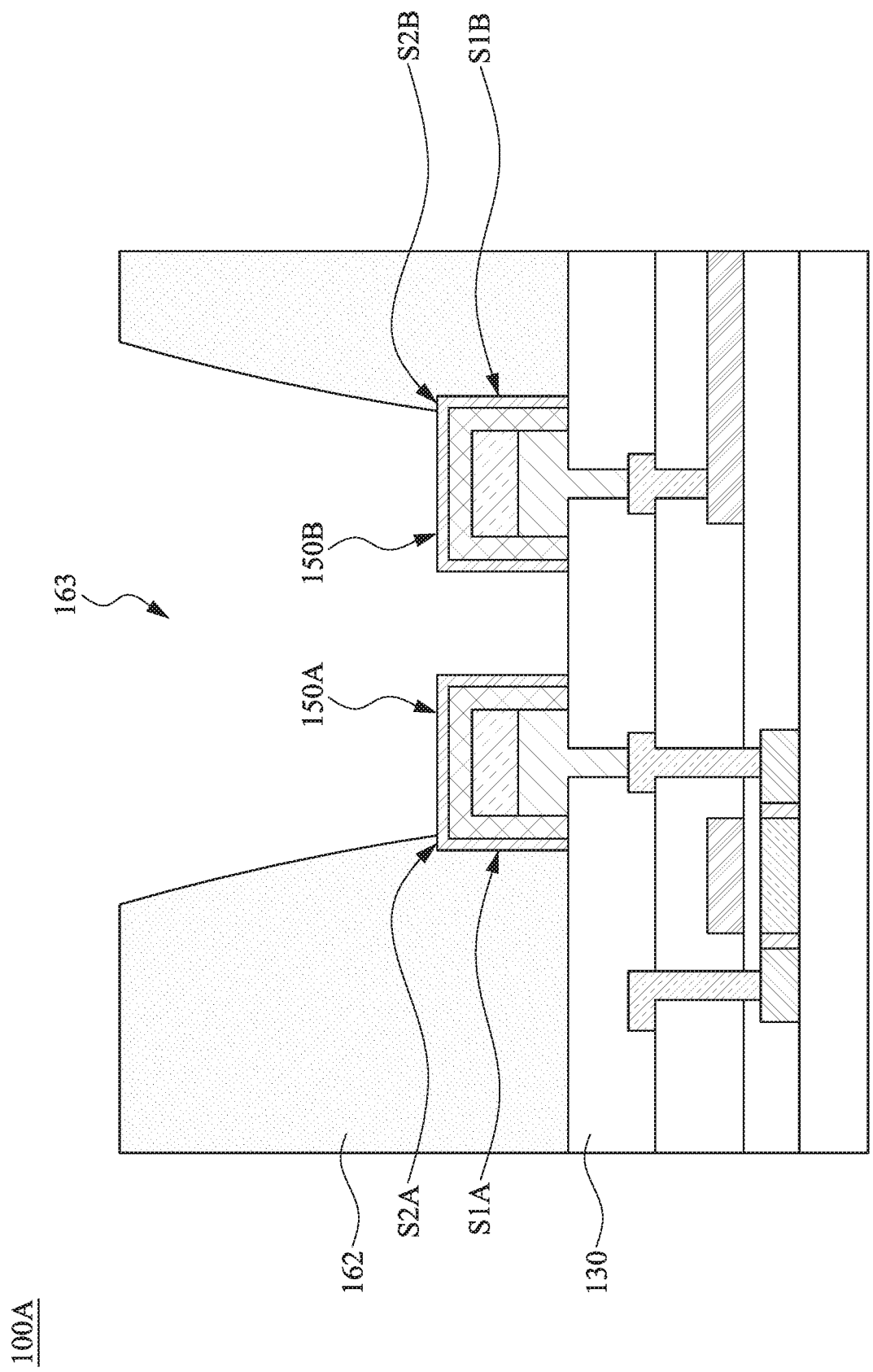

As shown in FIG. 1O and FIG. 1D, a light-shielding material 160 can be formed on the passivation layer 130, and the light-shielding material 160 is cured into a light-shielding layer 162. In particular, a light-shielding film covering the passivation layer 130 and the conductive structures 150A and 150B can be formed on the passivation layer 130 firstly, and the light-shielding film is patterned so as to form the light-shielding material 160. The patterning process includes an exposure process and a development process. In some embodiments, a halftone mask can be used in the exposure process of the patterning process.

The light-shielding material 160 is separated from the conductive structures 150A and 150B. For example, the light-shielding material 160 can have an opening 161 and the conductive structures 150A and 150B may be located within the opening 161 and spaced apart from an inner wall SW1 of the light-shielding material 160. In other words, the inner wall SW1 of the light-shielding material 160 can surround the conductive structures 150A and 150B. In an embodiment which the halftone mask is used in the exposure process, the bonding strength of the light-shielding material 160 at the opening 161 is less than that in other places for facilitating subsequent processes. In some embodiments, the conductive structures 150A and 150B are spaced apart from the inner wall SW1 of the light-shielding material 160 by a distance greater than 0 microns and less than or equal to 10 microns.

After the patterning process, the temperature of the light-shielding material 160 can be increased by performing a high temperature process to cure the light-shielding material 160 into the light-shielding layer 162. In some embodiments, the high temperature process which is performed to increase the temperature of the light-shielding material 160 is to provide a high temperature environment, and the temperature of the high temperature environment is in a range from 180° C. to 250° C., thereby increasing the temperature of the light-shielding material to be in a range from 180° C. to 250° C. During the high temperature process, at least a portion of the light-shielding material 160 is in a flowing state. The light-shielding material 160 in the flowing state flows along the outermost surface of the layer. For the light-shielding material 160 at or near the opening 161, it flows toward the conductive structures 150A and 150B and contacts a portion of the surfaces of the conductive structures 150A and 150B. Accordingly, after curing the light-shielding material 160 into the light-shielding layer 162, the light-shielding layer 162 covers and contacts a portion of the surfaces of the conductive structures 150A and 150B, as shown in FIG. 1D.

The extent to which the conductive structures 150A and 150B are covered by the light-shielding layer 162 can be adjusted by controlling the duration of the flow of the light-shielding material 160. For example, the conductive structures 150A and 150B have respective side surfaces S1A and S1B and respective top surfaces S2A and S2B. In the present embodiment, during the high temperature process, the light-shielding material 160 can extend from the side surfaces S1A and S1B of the conductive structures 150A and 150B to the top surfaces S2A and S2B of the conductive structures 150A and 150B, so that the light-shielding layer 162 formed by curing the light-shielding material 160 also extends from the side surfaces S1A and S1B of the conductive structures 150A and 150B to the top surfaces S2A and S2B of the conductive structures 150A and 150B, thereby covering the side surfaces S1A and S1B and the top surfaces S2A and S2B of the conductive structures 150A and 150B. In other embodiments, the light-shielding layer 162 can also cover the side surfaces S1A and S1B of the conductive structures 150A and 150B without covering the top surfaces S2A and S2B. In some embodiments, the thickness of the light-shielding layer 162 can be in a range from 30 microns to 100 microns. The "thickness of the light-shielding layer" herein may mean the height of the top surface of the light-shielding layer 162 with respect to the passivation layer 130. In addition, the formed light-shielding layer 162 has an opening 163, and the opening 163 overlaps the conductive structures 150A and 150B. In some embodiments, the light-shielding layer 162 may be a single layer structure or a composite layer structure, wherein each layer in the composite layer structure may include the same material, and the composite layer is formed by lamination and thereby increasing the thickness of the light-shielding layer 162.

Figure 1E:
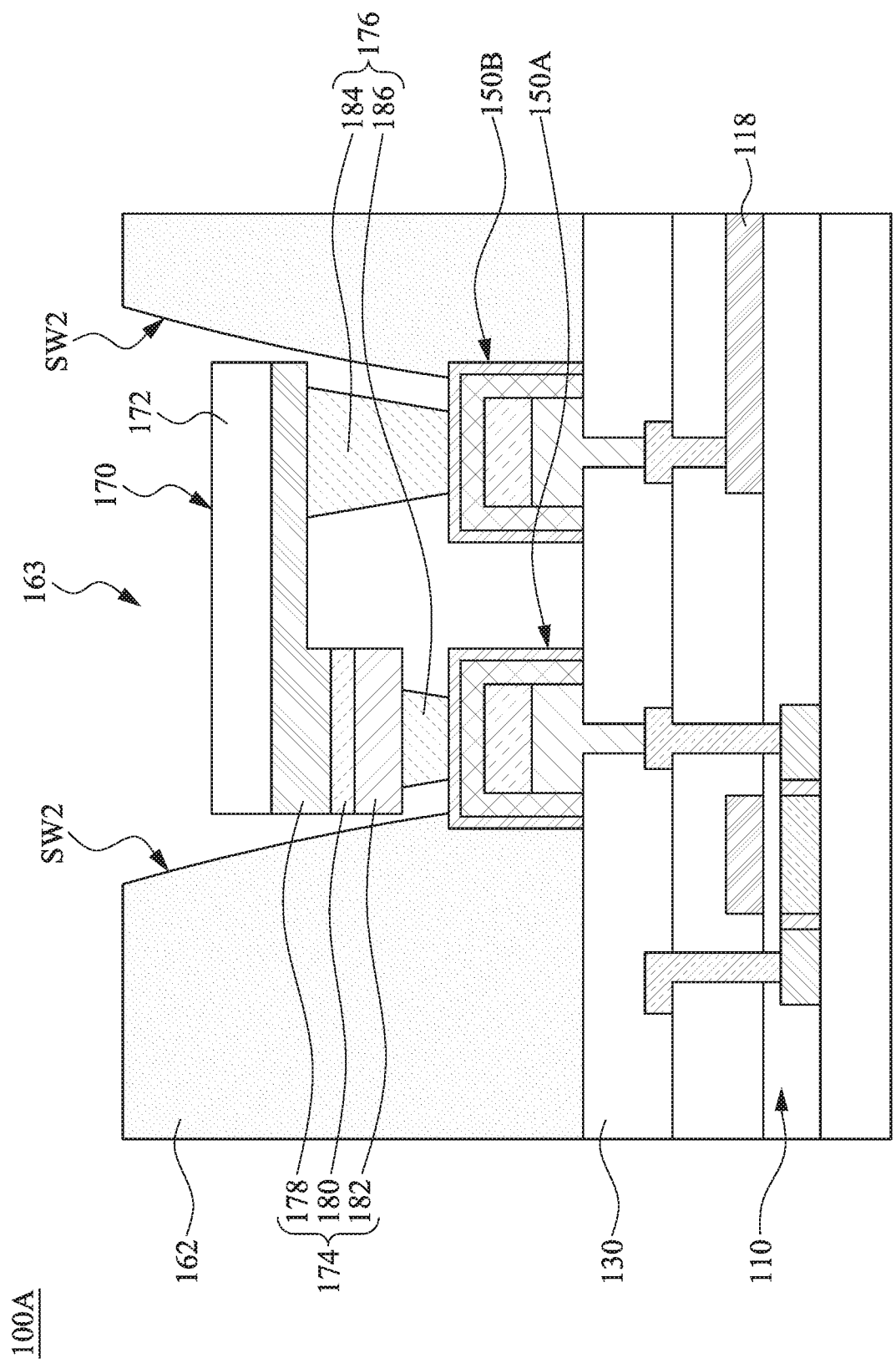

As shown in FIG. 1E, a light-emitting element 170 can be disposed on the passivation layer 130, and the light-emitting element 170 can be electrically connected to the conductive structures 150A and 150B. The light-emitting element 170 is disposed within the opening 163 of the light-shielding layer 162 and located above the conductive structures 150A and 150B. In the present embodiment, since the light-emitting element 170 disposed on the passivation layer 130 is electrically connected to the layers or elements below the passivation layer 130, e.g., the thin film transistor 110 or the first patterned metal layer 118, through being connected to the conductive structures 150A and 150B, the conductive structures 150A and 150B can be viewed as the bonding pads for bonding to the light-emitting element 170.

The light-emitting element 170 can be completed in other processes firstly, and then transferred to the opening 163 of the light-shielding layer 162. The step of disposing the light-emitting element 170 is later than the step of increasing the temperature of the light-shielding material. After the light-emitting element 170 is disposed into the opening 163 of the light-shielding layer 162, the inner wall SW2 of the light-shielding layer 162 can be spaced apart from the light-emitting element 170. In other words, the inner wall SW2 of the light-shielding layer 162 can surround the light-emitting element 170. In some embodiments, a die attach adhesive can be disposed on the light-emitting element 170 to fix the light-emitting element 170 and prevent the light-emitting element 170 from falling off the opening 163 of the light-shielding layer 162.

The light-emitting element 170 includes a substrate 172, a semiconductor structure 174, and an electrode structure 176. The semiconductor structure 174 is located between the substrate 172 and the electrode structure 176, and the semiconductor structure 174 is located between the passivation layer 130 and the substrate 172 in conjunction with the electrode structure 176. The semiconductor structure 174 includes a first semiconductor layer 178, an active layer 180, and a second semiconductor layer 182. The active layer 180 is located between the first semiconductor layer 178 and the second semiconductor layer 182. The first semiconductor layer 178, the active layer 180, and the second semiconductor layer 182 may be sequentially formed on the substrate 172, for example, by epitaxy. The respective widths of the active layer 180 and the second semiconductor layer 182 are smaller than the width of the first semiconductor layer 178, such that a portion of the first semiconductor layer 178 is not covered by the active layer 180 and the second semiconductor layer 182.

In some embodiments, the substrate 172 may be a sapphire substrate. The first semiconductor layer 178 may be an N-type semiconductor layer and include gallium nitride (GaN), aluminum gallium nitride (AlGaN), or a combination thereof, and has a thickness of about 1 micrometer. The active layer 180 may be a quantum well and include indium gallium nitride (InGaN), and has a thickness of about 10 nanometers. The second semiconductor layer 182 may be an P-type semiconductor layer and include gallium nitride, aluminum gallium nitride, gallium indium nitride, or a combination thereof, and has a thickness of about 10 nanometers.

The electrode structure 176 includes a first electrode 184 and a second electrode 186. The first electrode 184 can be connected to the first semiconductor layer 178, and the second electrode 186 can be connected to the second semiconductor layer 182. The height of the connection interface between the first electrode 184 and the first semiconductor layer 178 with respect to the passivation layer 130 is greater than the height of the connection interface between the second electrode 186 and the second semiconductor layer 182 with respect to the passivation layer 130, and the heights of the lower surfaces of first electrode 184 and the second electrode 186 with respect to the passivation layer 130 are substantially the same. In some embodiments, the material of each of the first electrode 184 and the second electrode 186 may be an alloy. The first electrode 184 and the second electrode 186 are respectively connected to the conductive structures 150B and 150A through a bonding process, so that the light-emitting element 170 can be electrically connected to the conductive structures 150A and 150B. In some embodiments, the bonding process is performed in a high temperature environment, and the temperature of the high temperature environment is in a range from 180° C. to 250° C., so as to facilitate bonding the electrode structure 176 of the light-emitting elements 170 to the conductive structures 150A and 150B and performing annealing. By this arrangement, after the bonding process, the semiconductor structure 174 of the light-emitting element 170 can be biased by the thin film transistor 110 and the first patterned metal layer 118, thereby driving the semiconductor structure 174 to emit light.

The light-emitting element 170 can be used as a light source or a pixel. In some embodiments, a quantum dot material or a fluorescent material may be disposed on the light-emitting element 170 such that the light-emitting element 170 acts as a light source and emits light to activate the quantum dot material or the fluorescent material. In other embodiments, a plurality of light-emitting elements 170 of the display device 100A can respectively provide different colors of light, such as red light, green light, and blue light, so that the plurality of light-emitting elements 170 are directly used as pixels to provide images. This can be achieved by including the semiconductor structure 174 with different materials.

By the aforementioned arrangement, since the light-shielding layer 162 covers and contacts a portion of the surfaces (e.g., the side surfaces or the top surfaces) of the conductive structures 150A and 150B, the probability of that the display device 100A reflects ambient light can be reduced. Furthermore, when the ambient light travels from the top of the display device 100A toward the opening 163 of the light-shielding layer 162, the probability of reflecting the ambient light from the conductive structures 150A and 150B can be reduced because a portion of the surfaces of the conductive structures 150A and 150B is covered by the light-shielding layer 162. On the other hand, the light-shielding layer 162 is also located above the thin film transistor 110, so as to reduce the probability of reflecting the ambient light from the thin film transistor 110. By reducing the probability of that the display device 100A reflects the ambient light, it is capable of avoiding the condition that the pixels of the display device 100A have non-uniform color while in a bright state, and also to avoiding the condition that the pixel of the display device 100A has white spot while in a dark state. On the other hand, the maximum height of the light-emitting element 170 with respect to the passivation layer 130 is less than the maximum height of the light-shielding layer 162 with respect to the passivation layer 130. Therefore, if the light-emitting element 170 has the phenomenon of a side light leakage, the light-shielding layer 162 can shield the side light leakage, thereby preventing the display device 100A from having color cast.

Figure 2:
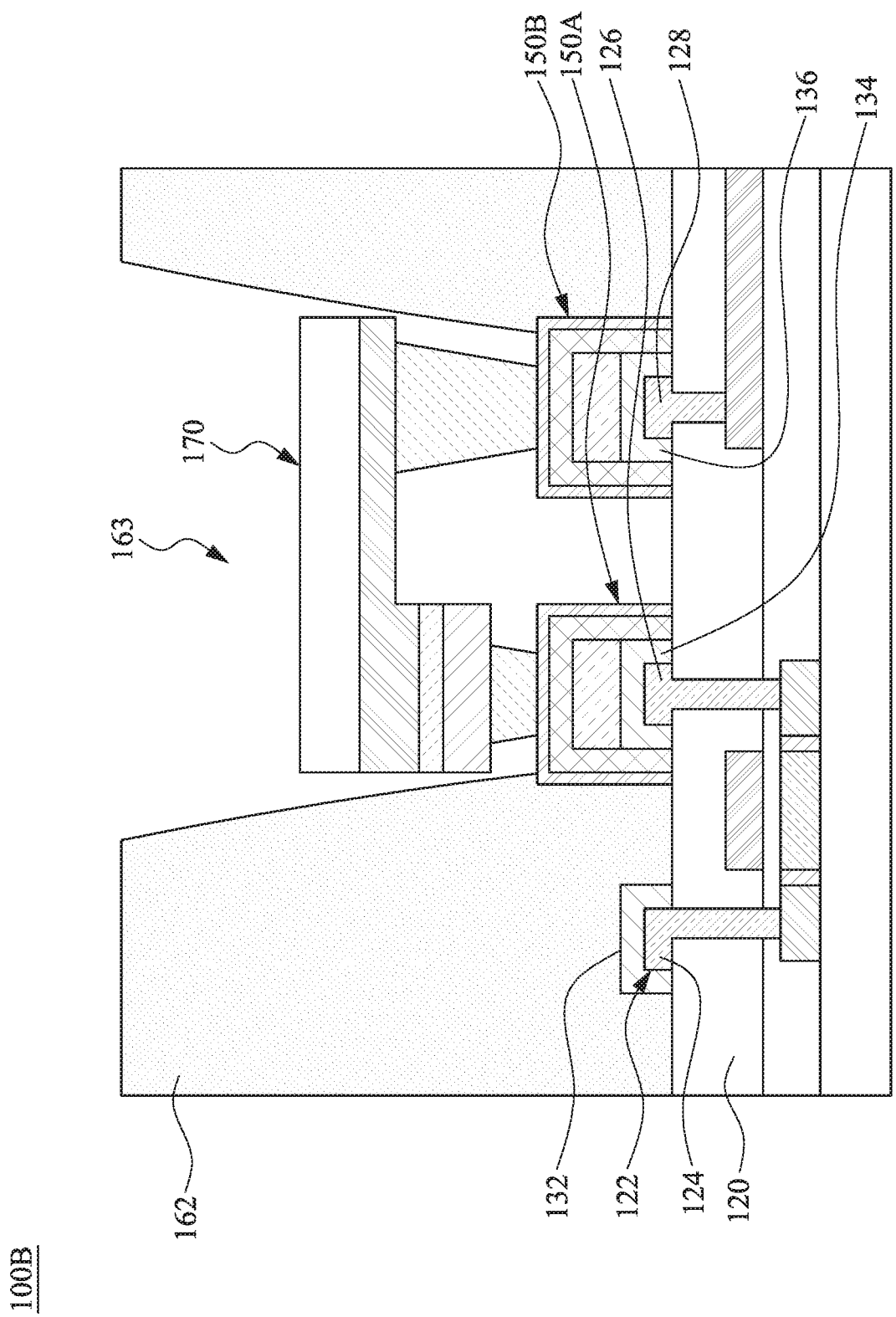
FIG. 2 illustrates a schematic side view of a display device according to a second embodiment of the present disclosure.

Reference is made to FIG. 2. FIG. 2 illustrates a schematic side view of a display device 100B according to a second embodiment of the present disclosure. At least one difference between the present embodiment and the first embodiment is that a passivation layer (e.g., the passivation layer 130 of FIG. 1E) is omitted in the display device 100B of the present embodiment. Specifically, in the present embodiment, after the wiring layer 122 is formed, the conductive pads 132, 134, and 136 can be directly formed on the first conductive portion 124, the second conductive portion 126, and the third conductive portion 128 of the wiring layer 122, and the conductive pads 132, 134 and 136 cover the first conductive portion 124, the second conductive portion 126 and the third conductive portion 128, respectively. Next, the conductive structures 150A and 150B and the light-shielding layer 162 can be formed on the dielectric layer 120 and the conductive pads 134 and 136. The steps of forming the conductive structures 150A and 150B and the light-shielding layer 162 may be the same as those in the first embodiment, and no further description is provided herein. Similarly, after forming the light-shielding layer 162, the light-emitting element 170 can be disposed into the opening 163 of the light-shielding layer 162, and the light-emitting element 170 is electrically connected to the conductive structures 150A and 150B.

In the present embodiment, a portion of the surfaces (e.g., the side surfaces or the top surfaces) of the conductive structures 150A and 150B, which are used as the bonding pads, still can be covered and contacted by the light-shielding layer 162, so that reducing the probability of the ambient light reflected by the display device 100B and preventing the display device 100B from having color cast are achieved. Moreover, since the passivation layer is omitted, it facilitates thinning the display device 100B.

Reference is made to FIG. 3A to FIG. 3D. FIG. 3A to FIG. 3D illustrate schematic side views of the method of manufacturing a display device 100C in various stages according to a third embodiment of the present disclosure. At least one difference between the present embodiment and the first embodiment is that the light-emitting element (the light-emitting element 170 in FIG. 3C) in the present embodiment is opposite to the light-emitting element in the first embodiment. In addition, in the present embodiment, the passivation layer 130, the conductive pads 132 and 134, and the layers or elements therebelow can be manufactured as described previously, and no further description is provided herein.

Figure 3A:
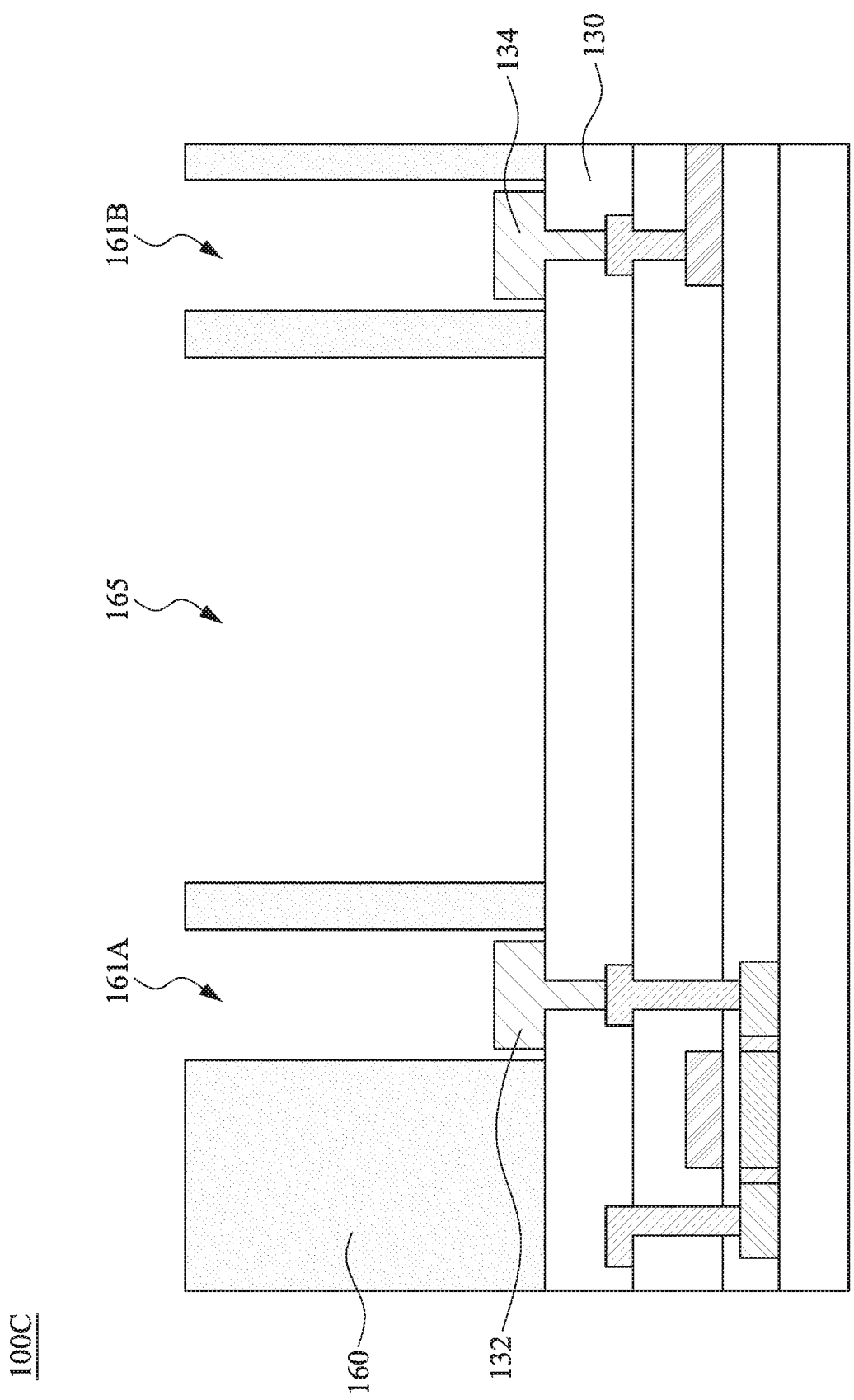
FIG. 3A to FIG. 3D illustrate schematic side views of the method of manufacturing a display device in various stages according to a third embodiment of the present disclosure.
Figure 3B:
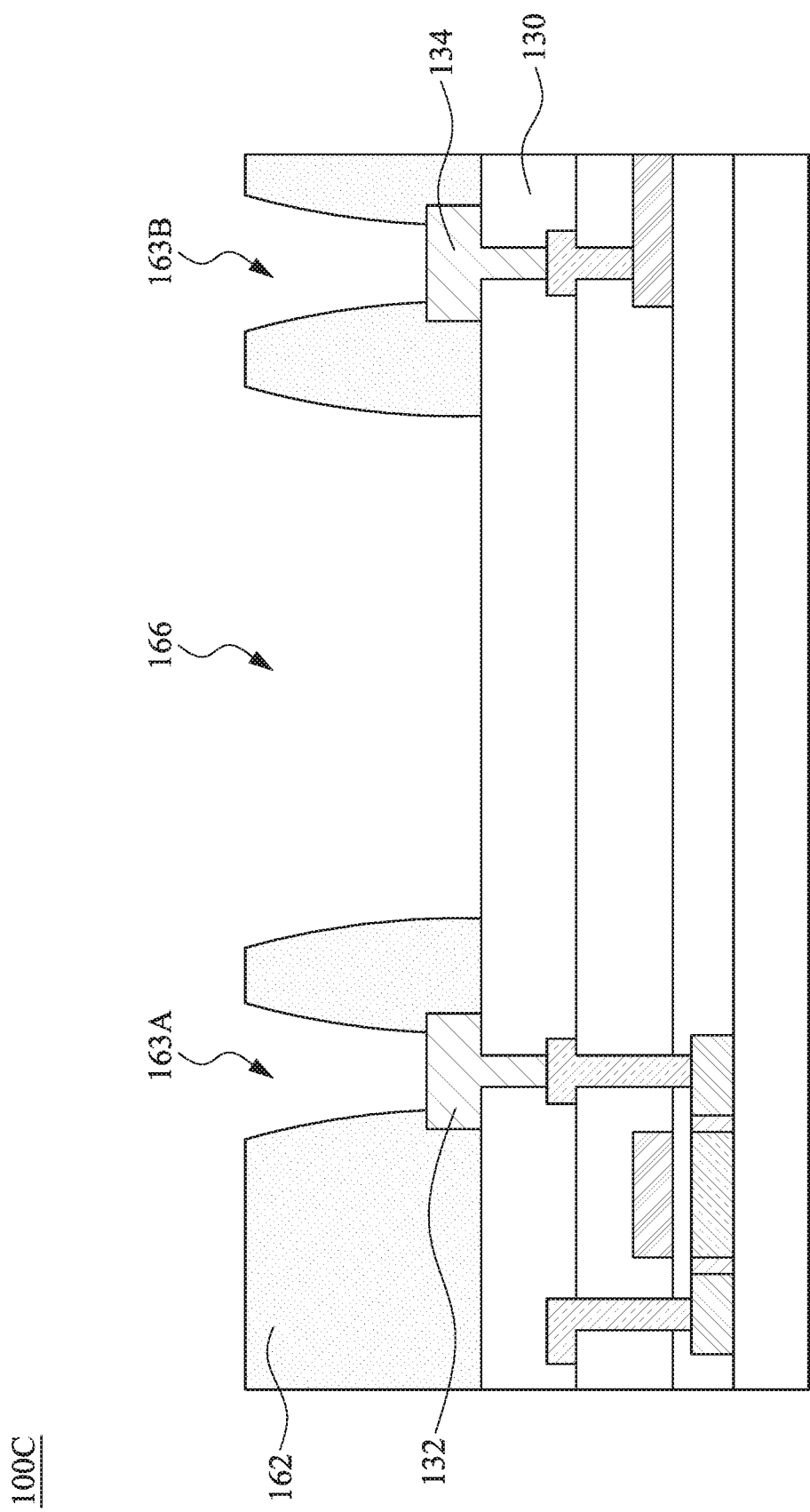

As shown in FIG. 3A and FIG. 3B, the light-shielding material 160 can be formed on the passivation layer 130, and the light-shielding material 160 is cured into the light-shielding layer 162. As described previously, the light-shielding film covering the passivation layer 130 and the conductive pads 132 and 134 can be formed first, and then the light-shielding film is patterned so as to form the light-shielding material 160. The light-shielding material 160 has openings 161A, 161B and 165, and the conductive pads 132 and 134 are respectively located in the openings 161A and 161B, and separated from the light-shielding material 160. The opening 165 is located between the openings 161A and 161B, and the width of the opening 165 is greater than the respective widths of the openings 161A and 161B.

Next, the temperature of the light-shielding material 160 can be increased by performing the high temperature process to cure the light-shielding material 160 into the light-shielding layer 162. During the high temperature process, at least a portion of the light-shielding material 160 is in the flowing state. For the light-shielding material 160 at or near the openings 161A and 161B, it flows toward the conductive pads 132 and 134 and contacts a portion of the surfaces (e.g., the side surfaces or the top surfaces) of the conductive pads 132 and 134. Therefore, after the light-shielding material 160 is cured into the light-shielding layer 162, the light-shielding layer 162 covers and contacts a portion of the surfaces of the conductive pads 132 and 134, as shown in FIG. 3B.

In the present embodiment, the light-shielding layer 162 extends from the respective side surfaces of the conductive pads 132 and 134 to the respective top surfaces of the conductive pads 132 and 134, so as to cover the side surfaces and the top surface of the conductive pads 132 and 134. In other embodiments, the light-shielding layer 162 can also cover the respective side surfaces of the conductive pads 132 and 134 without covering the respective top surfaces of the conductive pads 132 and 134. Moreover, the formed light-shielding layer 162 has the openings 163A, 163B, and 166. The openings 163A and 163B overlaps the conductive pads 132 and 134, respectively. The opening 166 is located between the openings 163A and 163B, and the width of the opening 166 is greater than the respective widths of the openings 163A and 163B.

Figure 3C:
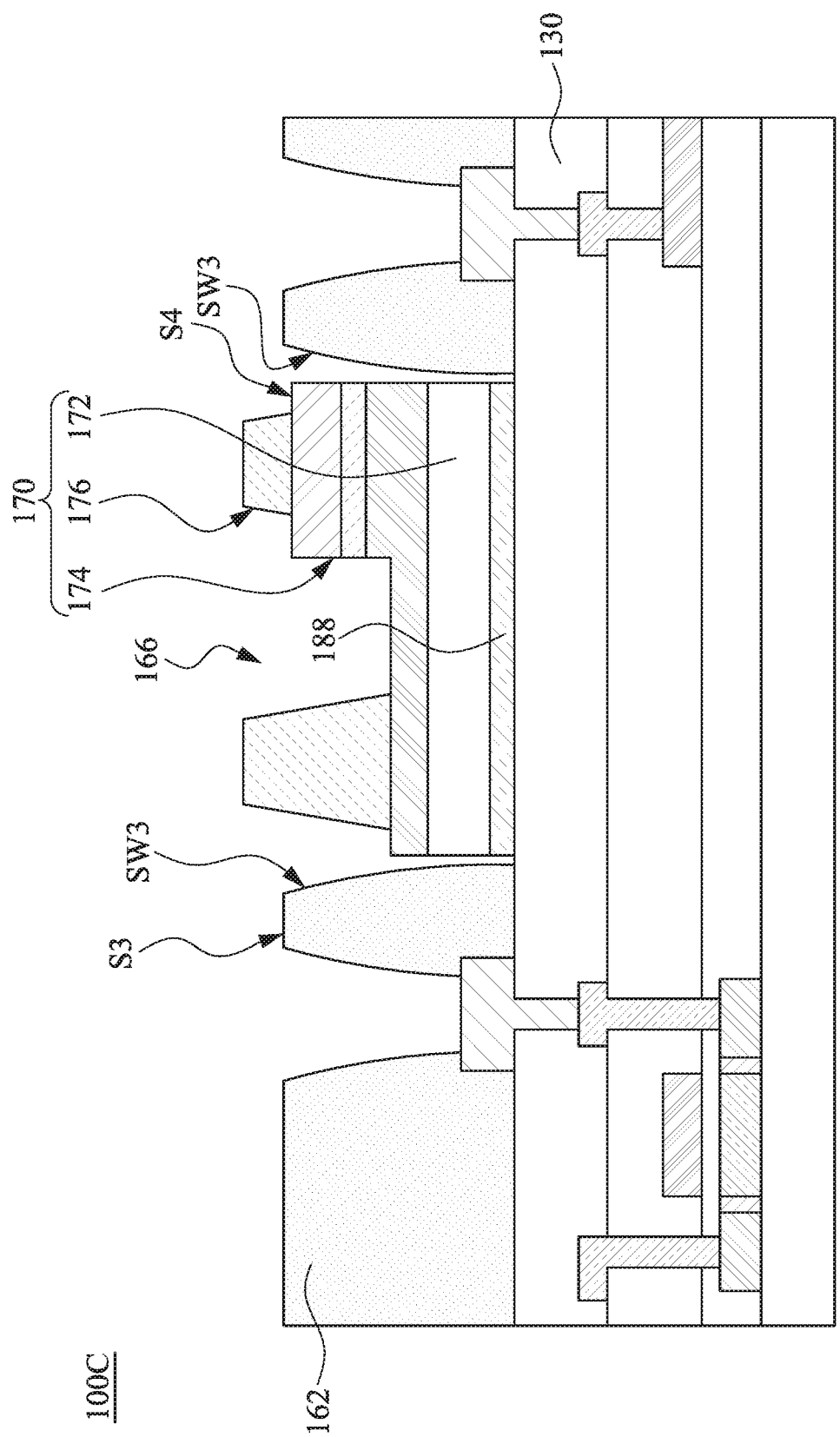

As shown in FIG. 3C, the light-emitting element 170 can be disposed on the passivation layer 130. The light-emitting element 170 is disposed within the opening 166 of the light-shielding layer 162 and located between the conductive pads 132 and 134. Similarly, the light-emitting element 170 can be completed in other processes first, and then transferred to the opening 166 of the light-shielding layer 162. The step of disposing the light-emitting element 170 is later than the step of increasing the temperature of the light-shielding material. After the light-emitting element 170 is disposed into the opening 166 of the light-shielding layer 162, the inner wall SW3 of the light-shielding layer 162 can be separated from the light-emitting element 170. In other words, the inner wall SW3 of the light-shielding layer 162 can surround the light-emitting element 170. In some embodiments, a die attach adhesive can be disposed on the light-emitting element 170.

The light-emitting element 170 includes the substrate 172, the semiconductor structure 174, and the electrode structure 176, wherein the semiconductor structure 174 is located between the substrate 172 and the electrode structure 176. The substrate 172 and the semiconductor structure 174 of the light-emitting element 170 are located between the passivation layer 130 and the electrode structure 176. The substrate 172 of the light-emitting element 170 is connected to the passivation layer 130 through an adhesive layer 188, so as to be fixed on the surface of the passivation layer 130. The semiconductor structure 174 and the electrode structure 176 of the light-emitting element 170 may be the same as those of the light-emitting element in the first embodiment, and the light-emitting element 170 can be used as a light source or a pixel, and no further description is provided herein.

In addition, the light-shielding layer 162 can be higher than the semiconductor structure 174 of the light-emitting element 170. Specifically, the height of the top surface S3 of the light-shielding layer 162 with respect to the passivation layer 130 can be greater than the height of the top surface S4 of the semiconductor structure 174 of the light-emitting element 170 with respect to the passivation layer 130. As a result, if the semiconductor structure 174 of the light-emitting element 170 has a side light leakage, the light-shielding layer 162 can shield the side light leakage, thereby preventing the display device 100C from having color cast.

Figure 3D:
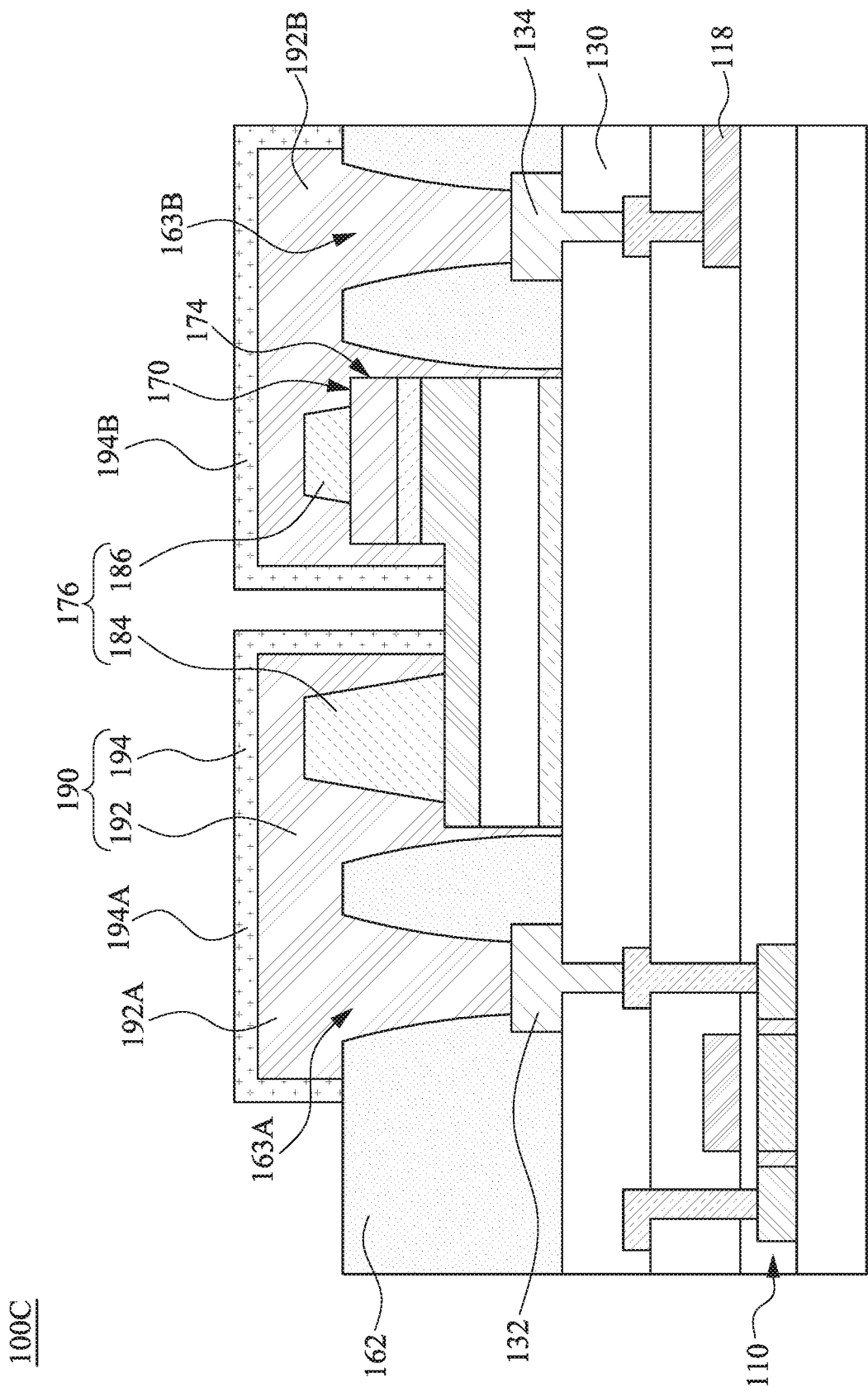

As shown in FIG. 3D, a connection structure 190 can be formed, so as to electrically connect the electrode structure 176 of the light-emitting element 170 to the conductive pads 132 and 134. The connection structure 190 includes a first conductor layer 192 and a second conductor layer 194.

The first conductor layer 192 may include a first connection portion 192A and a second connection portion 192B which are separated from each other. The first connection portion 192A covers the conductive pad 132, the first electrode 184 of the electrode structure 176 of the light-emitting element 170, and the light-shielding layer 162 between the conductive pad 132 and the light-emitting element 170. In other words, the first connection portion 192A can extend from the first electrode 184 of the electrode structure 176 of the light-emitting element 170, across a portion of the light-shielding layer 162, and then into the opening 163A, so as to be connected to the conductive pad 132. The second connection portion 192B covers the conductive pad 134, the second electrode 186 of the electrode structure 176 of the light-emitting element 170, and the light-shielding layer 162 between the conductive pad 134 and the light-emitting element 170. In other words, the second connection portion 192B can extend from the second electrode 186 of the electrode structure 176 of the light-emitting element 170, across a portion of the light-shielding layer 162, and then into the opening 163B, so as to be connected to the conductive pad 134. By this arrangement, the first connection portion 192A can be electrically connected to the thin film transistor 110, and the second connection portion 192B can be electrically connected to the first patterned metal layer 118. Therefore, the semiconductor structure 174 of the light-emitting element 170 can be biased by the thin film transistor 110 and the first patterned metal layer 118, thereby driving the semiconductor structure 174 to emit light.

The second conductor layer 194 may include a first protection portion 194A and a second protection portion 194B which are separated from each other. The first protection portion 194A covers the first connection portion 192A, and the second protection portion 194B covers the second connection portion 192B. The material of the first protection portion 194A and the second protection portion 194B of the second conductor layer 194 includes a transparent conductive material, such as indium tin oxide, indium zinc oxide, zinc oxide, indium gallium zinc oxide or other suitable materials. By the material properties of the transparent conductive material, it can prevent the first connection portion 192A and the second connection portion 192B of the first conductor layer 192 from being oxidized. Furthermore, the second conductor layer 194 can be formed in conjunction with other layers in the display device 100C. For example, if there is a requirement for a peripheral region (or referred to as a non-display region) of the display device 100C to form a transparent conductive layer thereon, the second conductor layer 194 can be formed of the same transparent conductive material as this transparent conductive layer by using the same mask in the process.

In the present embodiment, the light-emitting element 170 and the connection structure 190 which are disposed on the passivation layer 130 are electrically connected to the layers or elements below the passivation layer 130, e.g., the thin film transistor 110 and the first patterned metal layer 118, through the conductive pads 132 and 134, so that the conductive pads 132 and 134 can be regarded as the bonding pads of the display device 100C. In this regard, since the light-shielding layer 162 covers and contacts a portion of the surfaces (e.g., the side surfaces or the top surfaces) of the conductive pads 132 and 134 which act as the bonding pads, reducing the probability of that the display device 100C reflects the ambient light can be achieved.

Figure 4:
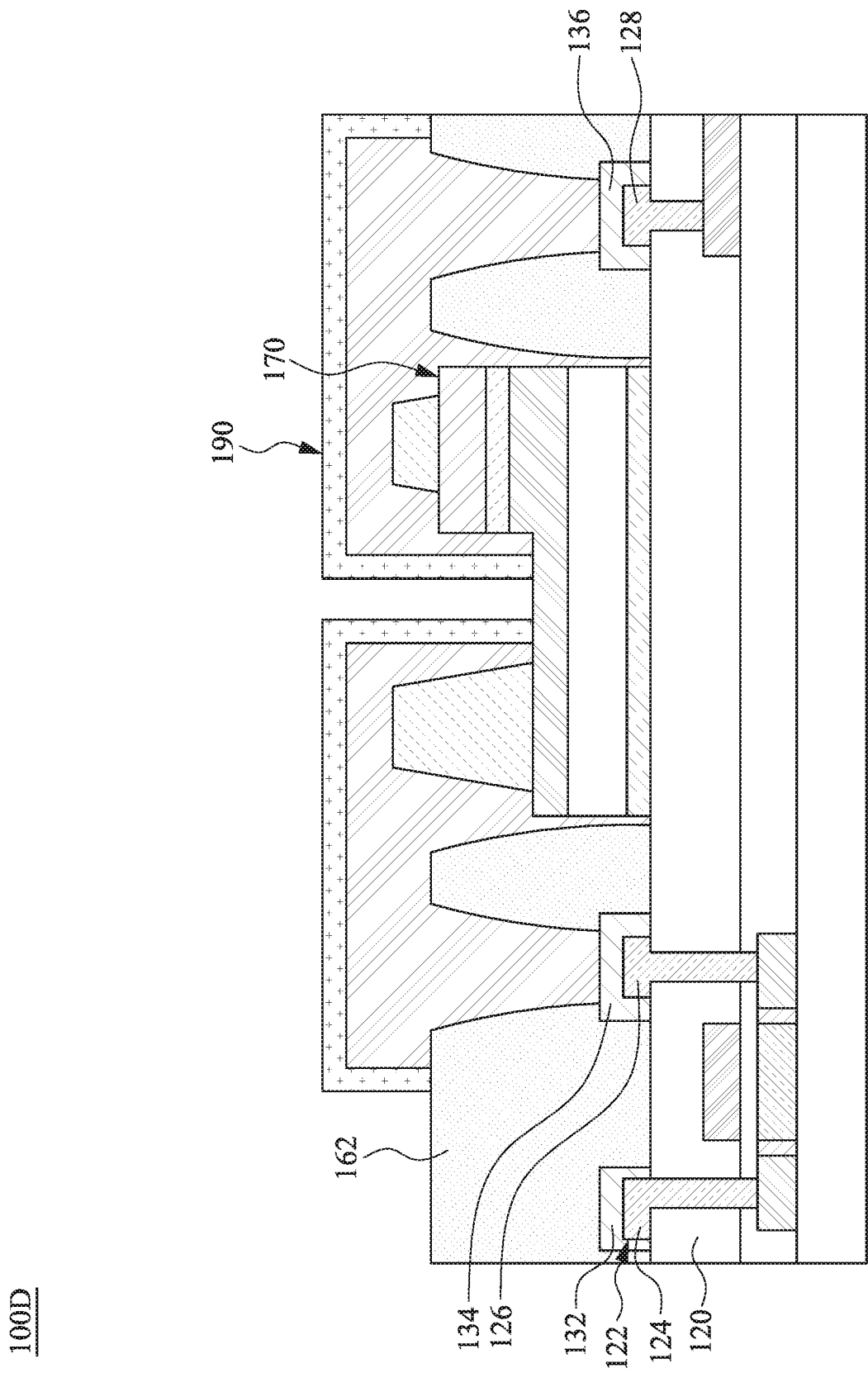
FIG. 4 illustrates a schematic side view of a display device according to a fourth embodiment of the present disclosure.

Reference is made to FIG. 4. FIG. 4 illustrates a schematic side view of a display device 100D according to a fourth embodiment of the present disclosure. At least one difference between the present embodiment and the third embodiment is that a passivation layer (e.g., the passivation layer 130 in FIG. 3D) is omitted in the display device 100D of the present embodiment. Specifically, in the present embodiment, after the wiring layer 122 is formed, the conductive pads 132, 134, and 136 can be directly formed on the first conductive portion 124, the second conductive portion 126, and the third conductive portion 128 of the wiring layer 122, and the conductive pads 132, 134, and 136 covers the first conductive portion 124, the second conductive portion 126, and the third conductive portion 128, respectively.

Next, the light-shielding material can be formed on the dielectric layer 120, and the temperature of the light-shielding material can be increased by performing the high temperature process to cure the light-shielding material into the light-shielding layer 162. During the high temperature process, the light-shielding material flows to, covers and contacts a portion of the surfaces (e.g., the side surfaces or top surfaces) of the conductive pads 134 and 136. After curing the light-shielding material into the light-shielding layer 162, the light-shielding layer 162 covers and contacts a portion of the surfaces (e.g., the side surfaces or the top surfaces) of the conductive pads 134 and 136. Thereafter, the light-emitting element 170 can be disposed on the dielectric layer 120, and the connection structure 190 is formed to electrically connect the light-emitting element 170 to the conductive pads 134 and 136. The manner of forming the connection structure 190 can be the same as that described previously, and no further description is provided herein.

In the present embodiment, a portion of the surfaces (e.g., the side surfaces or the top surfaces) of the conductive pads 134 and 136, which are used as the bonding pads, still can be covered and contacted by the light-shielding layer 162, so that reducing the probability of that the display device 100D reflects the ambient light and preventing the display device 100D from having color cast are achieved. In addition, since the passivation layer is omitted, it facilitates thinning the display device 100D.

Figure 5A:
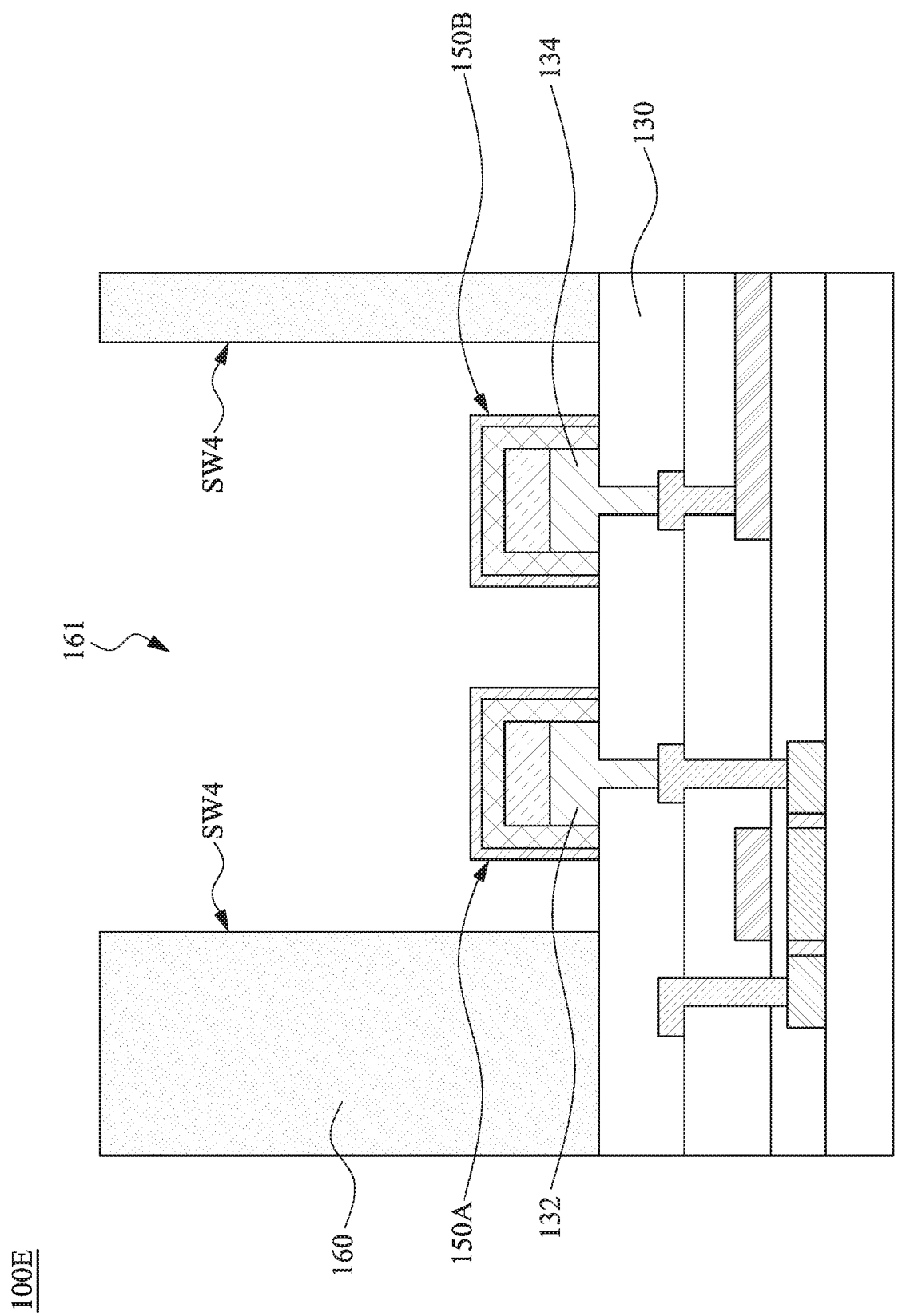
FIG. 5A and FIG. 5B illustrate schematic side views of the method of manufacturing a display device in various stages according to a fifth embodiment of the present disclosure.
Figure 5B:
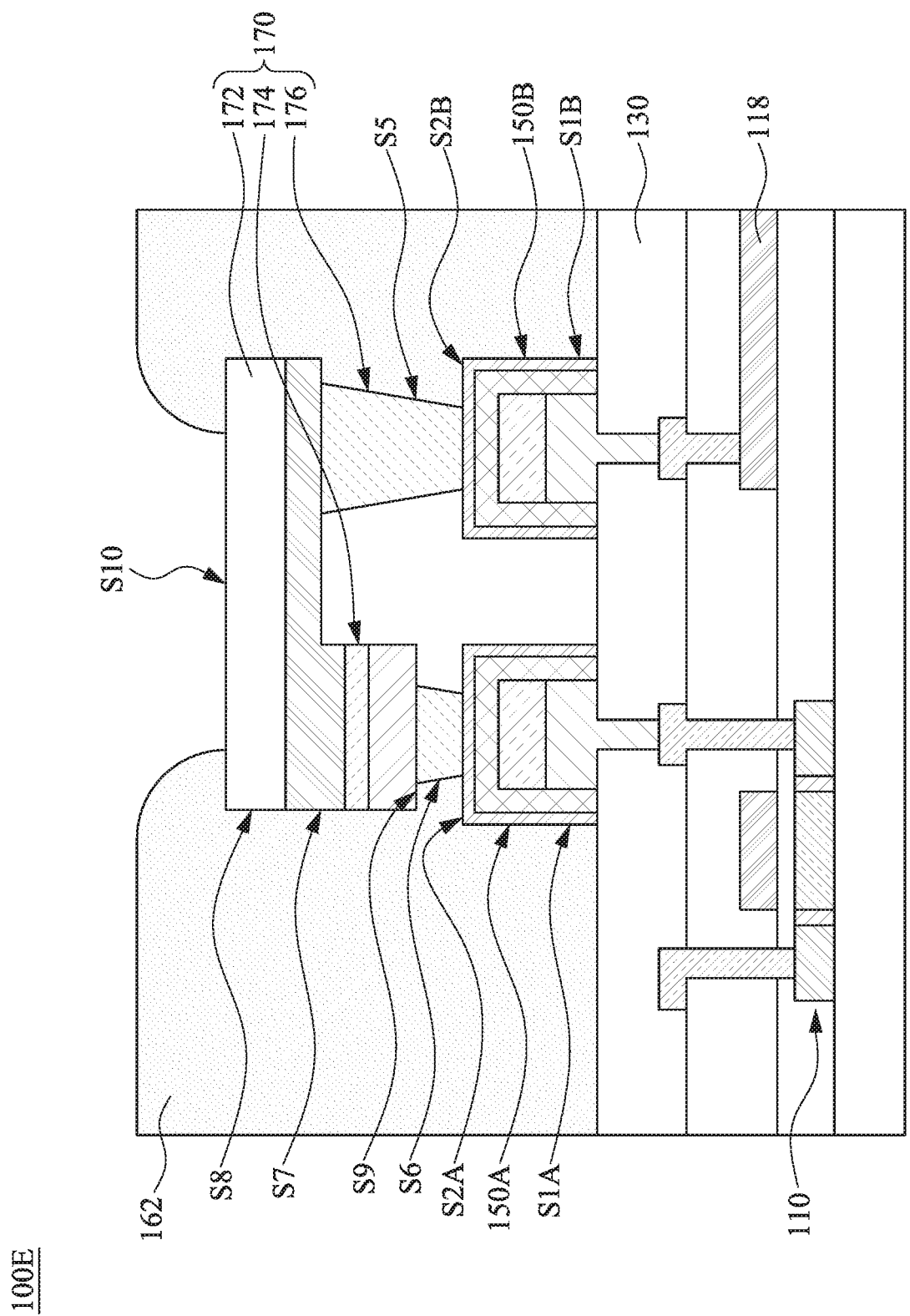

Reference is made to FIG. 5A and FIG. 5B. FIG. 5A and FIG. 5B illustrate schematic side views of the method of manufacturing a display device 100E in various stages according to a fifth embodiment of the present disclosure. At least one difference between the present embodiment and the first embodiment is that the light-shielding layer (the light-shielding layer 162 of FIG. 5B) in the present embodiment contacts the light-emitting element (the light-emitting element 170 of FIG. 5B). In addition, in the present embodiment, the conductive structures 150A and 150B, the conductive pads 132 and 134, the passivation layer 130, and the layers or elements therebelow can be manufactured as described previously, and no further description is provided herein.

As shown in FIG. 5A, the light-shielding material 160 can be formed on the passivation layer 130. As described previously, the light-shielding film covering the passivation layer 130 and the conductive structures 150A and 150B can be formed first, and then the light-shielding film is patterned to form the light-shielding material 160. The light-shielding material 160 has the opening 161, and the conductive structures 150A and 150B are located within the opening 161 and spaced apart from the inner wall SW4 of the light-shielding material 160. In other words, the inner wall SW4 of the light-shielding material 160 can surround the conductive structures 150A and 150B. In some embodiments, the conductive structures 150A and 150B can be spaced apart from the inner wall SW4 of the light-shielding material 160 by a distance of less than 10 microns.

As shown in FIG. 5B, the light-emitting element 170 can be disposed on the passivation layer 130, and the temperature of the light-shielding material (e.g., the light-shielding material 160 of FIG. 5A) is increased to cure the light-shielding material into the light-shielding layer 162. In the present embodiment, the high temperature process for increasing the temperature of the light-shielding material and the bonding process for bonding the electrode structure 176 of the light-emitting element 170 to the conductive structures 150A and 150B are performed simultaneously. In other words, the electrode structure 176 of the light-emitting element 170 can be bonded to the conductive structures 150A and 150B during the high temperature process.

The light-emitting element 170 includes the substrate 172, the semiconductor structure 174, and the electrode structure 176. The semiconductor structure 174 is located between the electrode structure 176 and the substrate 172, and the electrode structure 176 is located between the conductive structures 150A and 150B and the semiconductor structure 174. After the light-emitting element 170 is disposed on the conductive structures 150A and 150B, the high temperature process can be performed so as to increase the temperature of the light-shielding material and perform the bonding process. In some embodiments, the high temperature process is performed to provide a high temperature environment having a temperature in a range from 180° C. to 250° C. The high temperature environment not only can increase the temperature of the light-shielding material to be in a range from 180° C. to 250° C., but it also can bond the electrode structure 176 of the light-emitting element 170 to the conductive structures 150A and 150B. Moreover, before performing the high temperature process, the light-emitting element 170 may be spaced apart from the inner wall of the light-shielding material (e.g., the inner wall SW4 of FIG. 5A).

During the high temperature process, at least a portion of the light-shielding material is in the flowing state. Therefore, the light-shielding material in the flowing state flows toward the light-emitting element 170 and the conductive structures 150A and 150B, and flows to and contacts the light-emitting element 170 and the conductive structures 150A and 150B. Therefore, after the light-shielding material is cured into the light-shielding layer 162, the light-shielding layer 162 covers and contacts a portion of the surfaces of the light-emitting element 170 and the conductive structures 150A and 150B.

For the conductive structures 150A and 150B, the light-shielding layer 162 can at least cover and contact a portion of the respective side surfaces S1A and S1B and a portion of the respective top surfaces S2A and S2B of the conductive structures 150A and 150B. In the present embodiment, the light-emitting element 170 disposed on the passivation layer 130 is electrically connected to the layers or elements below the passivation layer 130 e.g., the thin film transistor 110 and the first patterned metal layer 118, through the conductive structures 150A and 150B, so that the conductive structures 150A and 150B can be viewed as the bonding pads of the display device 100E. In this regard, since the light-shielding layer 162 covers and contacts the conductive structures 150A and 150B which act as the bonding pads, reducing the probability of that the display device 100E reflects the ambient light can be achieved.

For the light-emitting element 170, the light-shielding layer 162 can at least cover and contact a portion of the side surfaces S5 and S6 of the electrode structure 176, a portion of the side surface S7 of the semiconductor structure 174, and a portion of the side surface S8 of the substrate 172. In some embodiments, the side surfaces S5 and S6 of the electrode structure 176, the side surface S7 of the semiconductor structure 174, and the side surface S8 of the substrate 172 are completely covered by the light-shielding layer 162. In some embodiments, the light-shielding layer 162 may not contact the side surfaces S5 and S6 of the electrode structure 176. By such a arrangement, if the semiconductor structure 174 of the light-emitting element 170 has a side light leakage, the light-shielding layer 162 can shield the side light leakage, thereby preventing the display device 100E from having color cast.

Furthermore, the semiconductor structure 174 of the light-emitting element 170 has a lower surface S9, and the lower surface S9 of the semiconductor structure 174 faces the conductive structures 150A and 150B. The substrate 172 of the light-emitting element 170 has an top surface S10, and the top surface S10 of the substrate 172 faces away from the conductive structures 150A and 150B. The light-shielding layer 162 can at least cover a portion of the lower surface S9 of the semiconductor structure 174 and a portion of the top surface S10 of the substrate 172. However, the present disclosure is not limited thereto. In other embodiments, the light-shielding layer 162 can cover a portion of the top surface S10 of the substrate 172 without covering the lower surface S9 of the semiconductor structure 174. The extent to which the light-emitting element 170 covered by the light-shielding layer 162 can be adjusted by controlling the duration of the flow of the light-shielding material, e.g., controlling time parameters, temperature parameters, or other relevant parameters of the high temperature process. As a result, the connection strength of the light-emitting element 170 with the conductive structures 150A and 150B can be enhanced by that the light-emitting element is covered by the light-shielding layer 162, thereby preventing the light-emitting element 170 from falling off the conductive structures 150A and 150B.

On the other hand, during the high temperature process, the connection interface between the electrode structure 176 of the light-emitting element 170 and the conductive structures 150A and 150B can be annealed by the high temperature environment, so as to reduce the impedance between the electrode structure 176 of the light-emitting element 170 and the conductive structures 150A and 150B.

Accordingly, after completing the high temperature process, not only can the light-shielding material be cured into the light-shielding layer 162, but the electrode structure 176 of the light-emitting element 170 can also be bonded to the conductive structures 150A and 150B, thereby electrically connecting the electrode structure 176 of the light-emitting element 170 to the conductive structures 150A and 150B.

Figure 6:
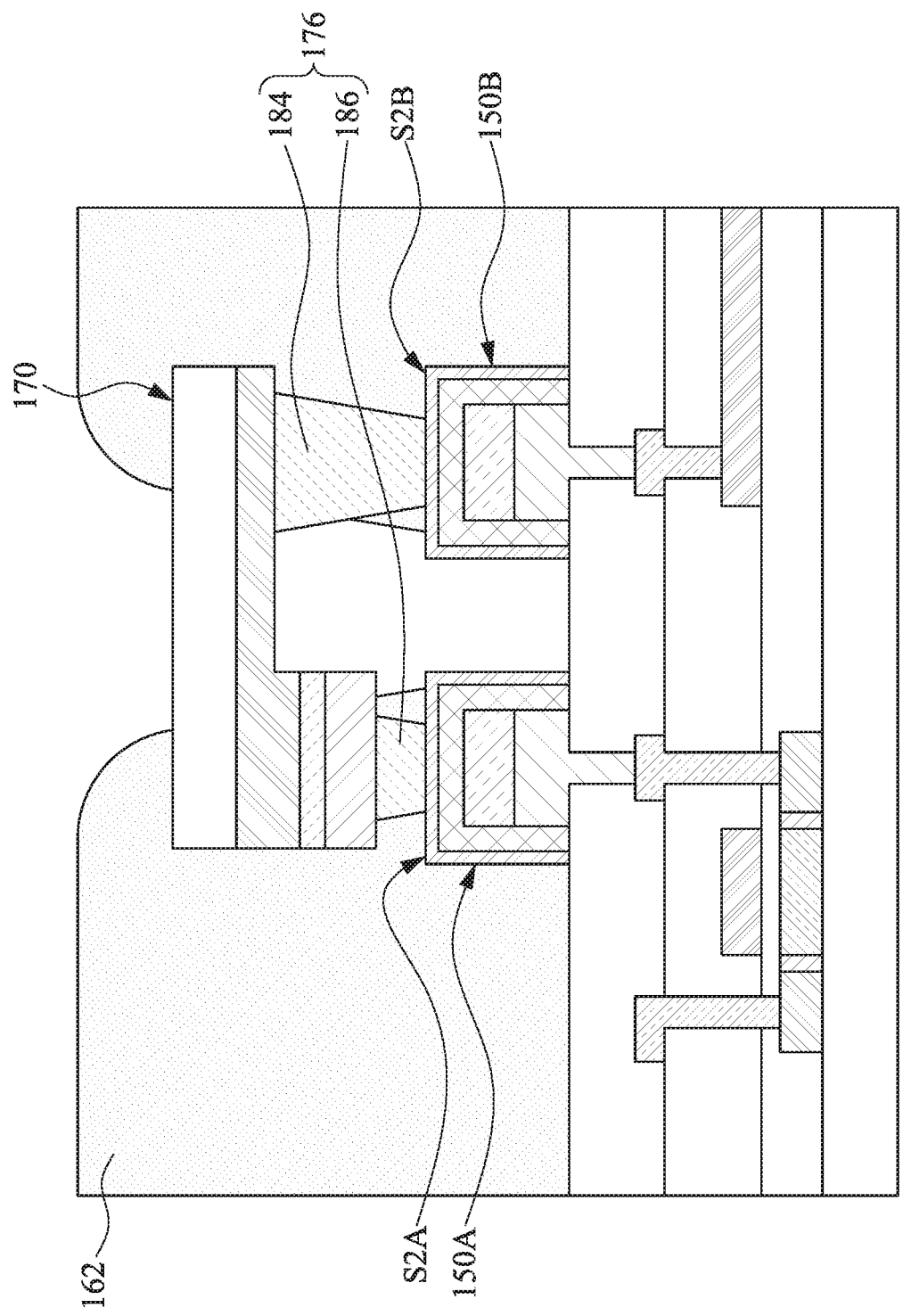
FIG. 6 illustrates a schematic side view of a display device according to a sixth embodiment of the present disclosure.

Reference is made to FIG. 6. FIG. 6 illustrates a schematic side view of a display device 100F according to a sixth embodiment of the present disclosure. At least one difference between the present embodiment and the fifth embodiment is that the light-shielding layer 162 of the present embodiment covers the conductive structures 150A and 150B and the light-emitting element 170 more than that of the fifth embodiment. In specific, the light-shielding layer 162 covering the top surfaces S2A and S2B of the conductive structures 150A and 150B can extend to between the first electrode 184 and the second electrode 186 of the electrode structure 176 of the light-emitting element 170, thereby further enhancing the strength of the connection between the light-emitting element 170 and the conductive structures 150A and 150B. The "the conductive structures 150A and 150B can extend to between the first electrode 184 and the second electrode 186 of the electrode structure 176 of the light-emitting element 170" herein may mean that the distance between the light-shielding layer 162 covering the conductive structure 150A and the light-shielding layer 162 covering the conductive structure 150B is smaller than the distance between the first electrode 184 and the second electrode 186.

Figure 7:
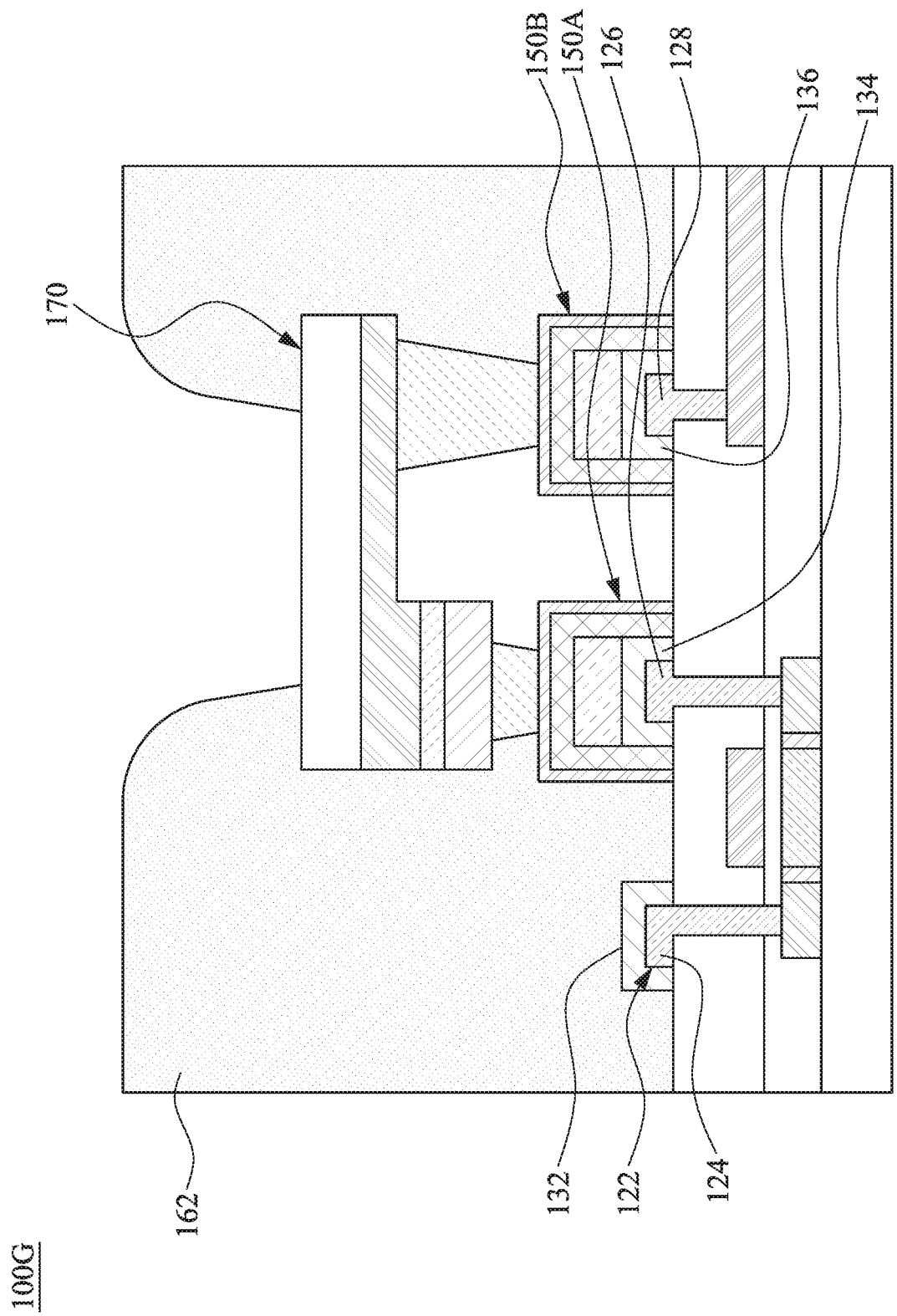
FIG. 7 illustrates a schematic side view of a display device according to a seventh embodiment of the present disclosure.

Reference is made to FIG. 7. FIG. 7 illustrates a schematic side view of a display device 100G according to a seventh embodiment of the present disclosure. At least one difference between the present embodiment and the fifth embodiment is that a passivation layer (e.g., the passivation layer 130 of FIG. 5B) is omitted in the display device 100G of the present embodiment. Specifically, in the present embodiment, after the wiring layer 122 is formed, the conductive pads 132, 134, and 136 can be directly formed on the first conductive portion 124, the second conductive portion 126, and the third conductive portion 128 of the wiring layer 122, and the conductive pads 132, 134, and 136 cover the first conductive portion 124, the second conductive portion 126, and the third conductive portion 128, respectively. Next, the conductive structures 150A and 150B can be formed on the conductive pads 134 and 136. The steps of forming the conductive structures 150A and 150B may be the same as described previously, and no further description is provided herein.

Thereafter, the light-shielding material can be formed, and the light-emitting element 170 is disposed within the opening of the light-shielding material, in which the light-emitting element 170 is located on the conductive structures 150A and 150B. Next, the high temperature process can be performed, so as to increase the temperature of the light-shielding material and perform the bonding process on the light-emitting element 170.

During the high temperature process, the light-shielding material flows to and contacts the light-emitting element 170 and the conductive structures 150A and 150B. Accordingly, after the light-shielding material is cured into the light-shielding layer 162, the light-shielding layer 162 covers and contacts a portion of the surfaces (e.g., the side surfaces or the top surfaces) of the light-emitting element 170 and the conductive structures 150A and 150B, so that the probability of that the display device 100G reflects the ambient light can be reduced and color cast of the light-emitting element 170 caused by the side light leakage can be avoided. Furthermore, since the passivation layer is omitted, it facilitates thinning the display device 100G.

After the high temperature process is completed, the light-shielding material can be cured into the light-shielding layer 162. Besides, the electrode structure 176 of the light-emitting element 170 is bonded to the conductive structures 150A and 150B.

Figure 8A:
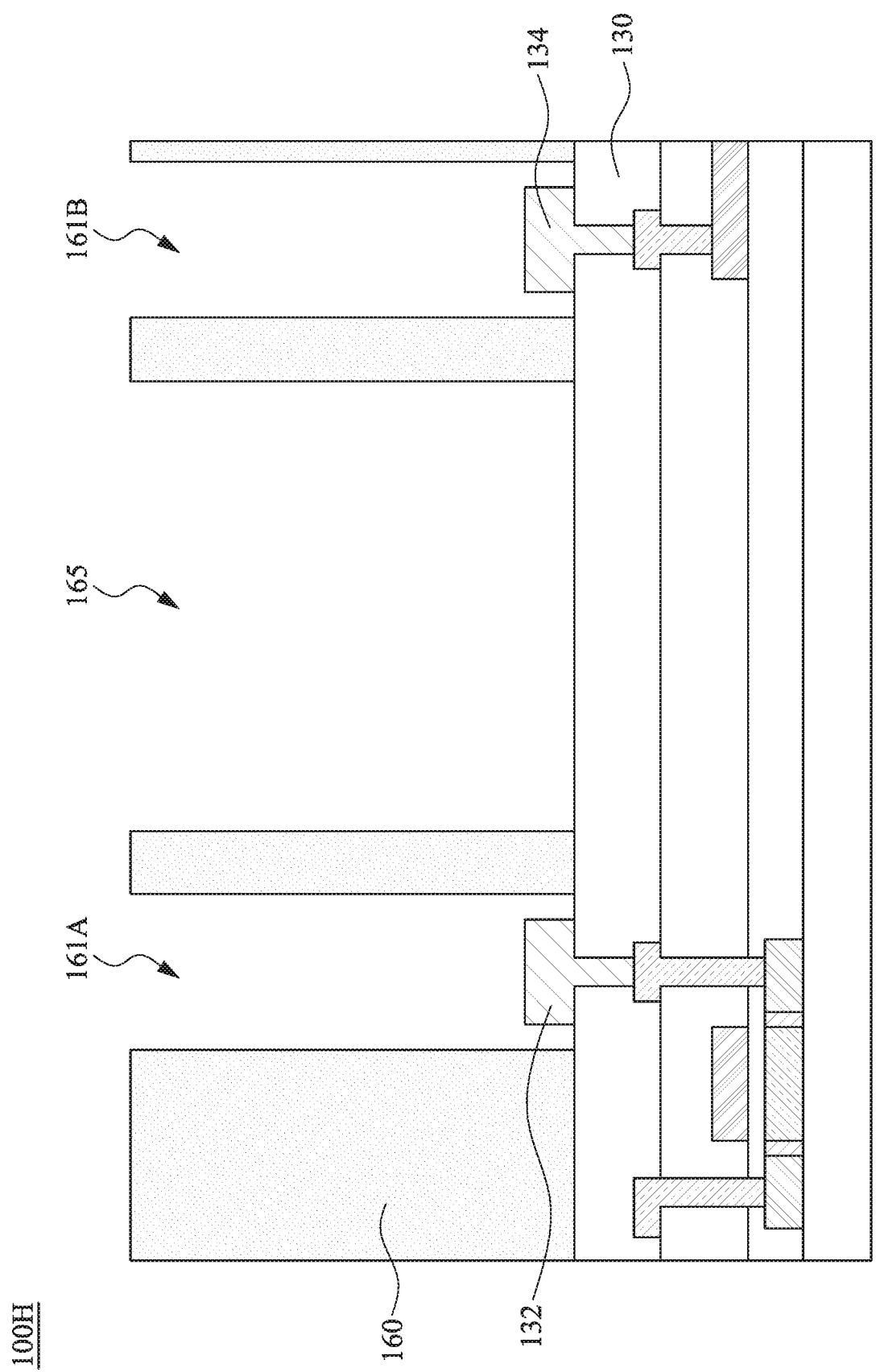
Figure 8B:
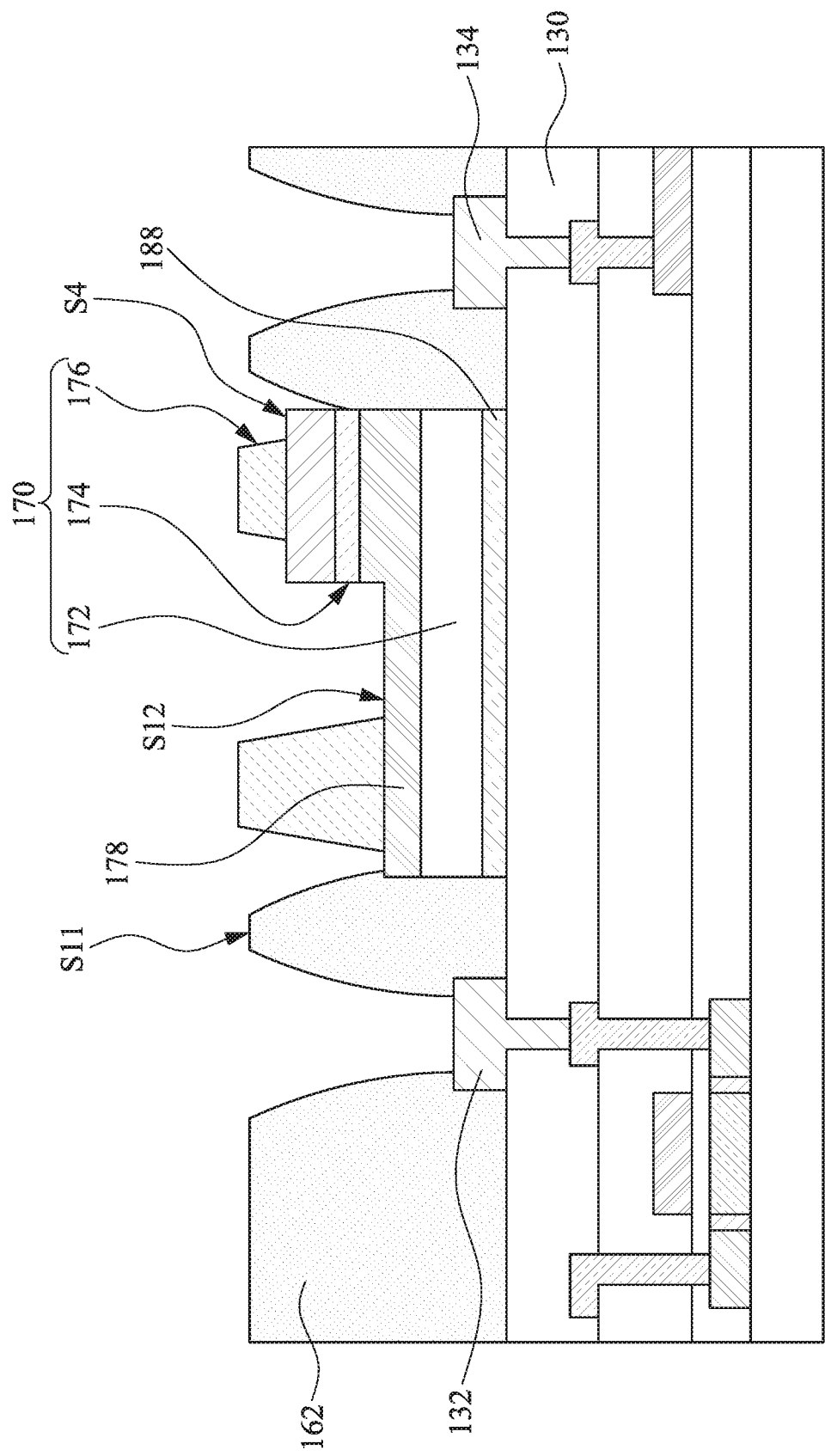

Reference is made to FIG. 8A to FIG. 8C. FIG. 8A to FIG. 8C illustrate schematic side views of the method of manufacturing a display device 100H in various stages according to an eighth embodiment of the present disclosure. At least one difference between the present embodiment and the third embodiment is that the light-shielding layer (the light-shielding layer 162 of FIG. 8B) of the present embodiment contacts the light-emitting element (the light-emitting element 170 of FIG. 8B). In addition, in the present embodiment, the passivation layer 130, the conductive pads 132 and 134, and the layers or elements therebelow can be manufactured as described previously, and no further description is provided herein.

As shown in FIG. 8A, the light-shielding material 160 can be formed on the passivation layer 130. As described previously, the light-shielding film covering the passivation layer 130, the conductive pads 132 and 134 can be formed first, and then the light-shielding film is patterned so as to form the light-shielding material 160. The light-shielding material 160 has the openings 161A, 161B, and 165, and the conductive pads 132 and 134 are respectively located within the openings 161A and 161B and spaced apart from the light-shielding material 160. The opening 165 is located between the openings 161A and 161B, and the width of the opening 165 is greater than the respective widths of the openings 161A and 161B.

As shown in FIG. 8B, the light-emitting element 170 can be disposed on the passivation layer 130. The light-emitting element 170 includes the substrate 172, the semiconductor structure 174, and the electrode structure 176, wherein the semiconductor structure 174 is located between the substrate 172 and the electrode structure 176. The substrate 172 of the light-emitting element 170 and the semiconductor structure 174 are located between the passivation layer 130 and the electrode structure 176, and the substrate 172 of the light-emitting element 170 can be fixed to the surface of the passivation layer 130 through the adhesive layer 188.

After the light-emitting element 170 is disposed on the passivation layer 130, the temperature of the light-shielding material can be increased by performing the high temperature process to cure the light-shielding material into the light-shielding layer 162. During the high temperature process, the light-shielding material flows to and contacts the light-emitting element 170 and the conductive pads 132 and 134. Accordingly, after the light-shielding material is cured into the light-shielding layer 162, the light-shielding layer 162 covers and contacts a portion of the surfaces (e.g., the side surfaces or the top surfaces) of the light-emitting element 170 and the conductive pads 132 and 134, such that the probability of that the display device 100H reflects the ambient light is reduced and color cast of the light-emitting element caused by the side light leakage is avoided.

The light-shielding layer 162 can be higher than the semiconductor structure 174 of the light-emitting element 170. Specifically, the height of the top surface S11 of the light-shielding layer 162 with respect to the passivation layer 130 is greater than the height of the top surface S4 of the semiconductor structure 174 of the light-emitting element 170 with respect to the passivation layer 130. As a result, if the semiconductor structure 174 of the light-emitting element 170 has the side light leakage, the light-shielding layer 162 can shield the side light leakage, thereby preventing the display device 100H from having color cast.

Moreover, the first semiconductor layer 178 of the semiconductor structure 174 of the light-emitting element 170 has an top surface S12, and the top surface S12 of the first semiconductor layer 178 faces away from the substrate 172. The light-shielding layer 162 can at least cover a portion of the top surface S12 of the first semiconductor layer 178. As a result, the connection strength of the light-emitting element 170 with the passivation layer 130 can be enhanced by that the top surface S12 of the first semiconductor layer 178 is covered by the light-shielding layer 162, thereby preventing the light-emitting element 170 from falling off the passivation layer 130.

On the other hand, the adhesive layer 188 can be annealed by performing the high temperature process, so as to enhance the fixing strength of the substrate 172 of the light-emitting element 170 to the passivation layer 130.

As shown in FIG. 8C, the connection structure 190 can be formed to electrically connect the electrode structure 176 of the light-emitting element 170 with the conductive pads 132 and 134. Similarly, the connection structure 190 includes the first conductor layer 192 and the second conductor layer 194. The first connection portion 192A of the first conductive layer 192 can electrically connect the first electrode 184 of the electrode structure 176 of the light-emitting element 170 to the thin film transistor 110, and the second connection portion 192B of the first conductive layer 192 can electrically connect the second electrode 186 of the electrode structure 176 of the light-emitting element 170 to the first patterned metal layer 118. Therefore, the semiconductor structure 174 of the light-emitting element 170 can be biased by the thin film transistor 110 and the first patterned metal layer 118, thereby driving the semiconductor structure 174 to emit light.

In the present embodiment, the light-emitting element 170 and the connection structure 190 disposed on the passivation layer 130 are electrically connected to the layers or elements below the passivation layer 130, e.g., the thin film transistor 110 and the first patterned metal layer 118, through the conductive pads 132 and 134, so that the conductive pad 132 and the conductive pad 134 can be regarded as the bonding pads of the display device 100H.

Figure 9:
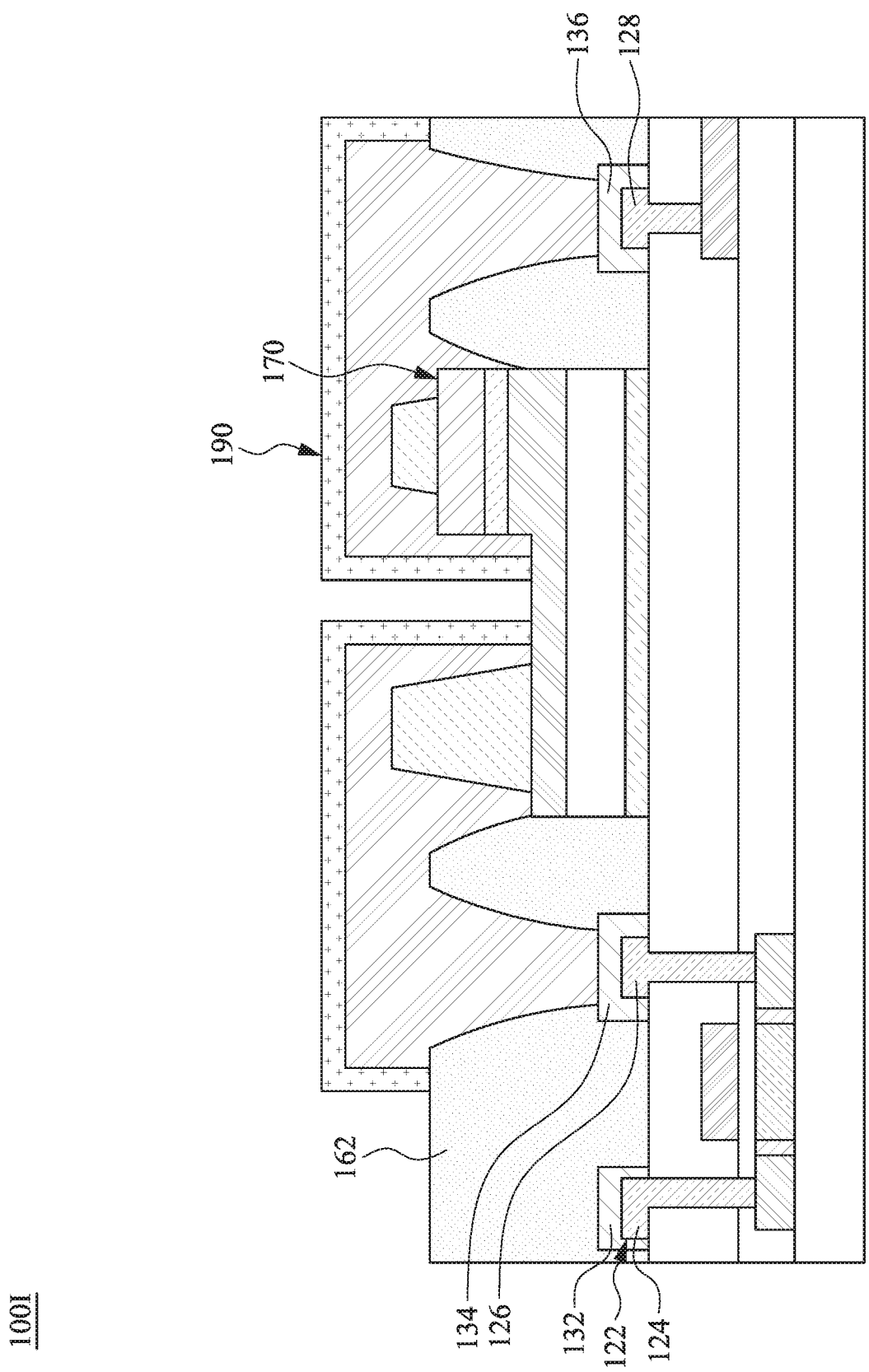
FIG. 9 illustrate a schematic side view of a display device according to a ninth embodiment of the present disclosure.

Reference is made to FIG. 9. FIG. 9 illustrate a schematic side view of a display device 100I according to a ninth embodiment of the present disclosure. At least one difference between the present embodiment and the eighth embodiment is that a passivation layer (e.g., the passivation layer 130 of FIG. 8C) is omitted in the display device 100I of the present embodiment. Specifically, in the present embodiment, after the wiring layer 122 is formed, the conductive pads 132, 134, and 136 can be directly formed on the first conductive portion 124, the second conductive portion 126, and the third conductive portion 128 of the wiring layer 122, and the conductive pads 132, 134 and 136 cover the first conductive portion 124, the second conductive portion 126 and the third conductive portion 128, respectively.

Next, the light-shielding material can be formed, and the light-emitting element 170 is disposed within the opening of the light-shielding material. Thereafter, the temperature of the light-shielding material can be increased by performing the high temperature process to cure the light-shielding material into the light-shielding layer 162. During the high temperature process, the light-shielding material flows to and contacts the light-emitting element 170 and the conductive pads 134 and 136. Accordingly, after the light-shielding material is cured into the light-shielding layer 162, the light-shielding layer 162 covers and contacts a portion of the surfaces (e.g., the side surfaces or the top surfaces) of the light-emitting element 170 and the conductive pads 134 and 136, thereby the probability of that the display device 100I reflects the ambient light can be reduced and display device 100I is prevented from having color cast, which is caused by the side light leakage of the light-emitting element.

After the light-shielding material is cured into the light-shielding layer 162, the connection structure 190 can be formed to electrically connect the light-emitting element 170 to the conductive pads 134 and 136. The manner of forming the connection structure 190 can be the same as that described previously, and no further description is provided herein.

In summary, the present disclosure provides a method of manufacturing a display device that includes allowing the light-shielding material to flow to and contact a portion of the surfaces of the bonding pad during curing the light-shielding material into the light-shielding layer. Since a portion of the surfaces of the bonding pad is covered by the light-shielding layer, the probability of the ambient light being reflected from the bonding pad can be reduced. Therefore, it is possible to avoid the condition that the pixels of the display device have non-uniform color in a bright state, and also to avoid the condition that the pixel of the display device has white spot in a dark state. Moreover, the light-emitting element can be electrically connected to the bonding pad for being used as a light source or a pixel. The formed light-shielding layer can surround the light-emitting element. Accordingly, if the light-emitting element has the phenomenon of side light leakage, the light-shielding layer can shield the side light leakage, thereby preventing the display device from having color cast.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A method of manufacturing a display device, comprising: forming a bonding pad on a dielectric layer; forming a light-shielding material on the dielectric layer; increasing a temperature of the light-shielding material such that the shielding material is cured into a light-shielding layer, wherein during curing the light-shielding material into the light-shielding layer, the light-shielding material flows to and contacts a portion of a surface of the bonding pad; and electrically connecting a light-emitting element to the bonding pad.

2. The method of manufacturing the display device of claim 1, wherein increasing the temperature of the light-shielding material is performed after forming the bonding pad and before electrically connecting the light-emitting element to the bonding pad.

3. The method of manufacturing the display device of claim 1, wherein during curing the light-shielding material into the light-shielding layer, the light-shielding material flows to and contacts a portion of a surface of the light-emitting element.

4. The method of manufacturing the display device of claim 1, wherein the temperature of the light-shielding material is increased such that the temperature of the light-shielding material is in a range from 180° C. to 250° C.

* * * * *